US011195822B2

(12) United States Patent
Pyeon et al.

(10) Patent No.: US 11,195,822 B2
(45) Date of Patent: Dec. 7, 2021

(54) LIGHT-EMITTING PACKAGE AND DISPLAY DEVICE INCLUDING THE SAME

(71) Applicant: SAMSUNG ELECTRONICS CO., LTD., Suwon-si (KR)

(72) Inventors: In Joon Pyeon, Yongin-si (KR); Changhoon Kwak, Hwaseong-si (KR); Moonsub Kim, Suwon-si (KR); Sangsu Kim, Suwon-si (KR); Myoungsun Ha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/862,648

(22) Filed: Apr. 30, 2020

(65) Prior Publication Data

US 2021/0066260 A1 Mar. 4, 2021

(30) Foreign Application Priority Data

Sep. 4, 2019 (KR) .......................... 10-2019-0109504

(51) Int. Cl.
*H01L 25/075* (2006.01)
*H01L 33/62* (2010.01)
*H01L 33/54* (2010.01)

(52) U.S. Cl.
CPC .......... *H01L 25/0753* (2013.01); *H01L 33/54* (2013.01); *H01L 33/62* (2013.01)

(58) Field of Classification Search
CPC ..... H01L 25/0753; H01L 33/62; H01L 33/54; H01L 33/58
See application file for complete search history.

(56) References Cited

U.S. PATENT DOCUMENTS

| 7,385,653 B2 | 6/2008 | Kim et al. |
| 7,399,108 B2 | 7/2008 | Ayabe et al. |
| 8,794,777 B2 | 8/2014 | Ito et al. |
| 2017/0373046 A1* | 12/2017 | Gardner .............. H01L 21/6835 |
| 2019/0019780 A1* | 1/2019 | Kim ........................ H01L 33/62 |
| 2019/0244939 A1* | 8/2019 | Liu .......................... H01L 33/48 |

(Continued)

FOREIGN PATENT DOCUMENTS

| JP | 2008-252015 A | 10/2008 |
| JP | 4230198 B2 | 2/2009 |

(Continued)

*Primary Examiner* — Victor A Mandala
(74) *Attorney, Agent, or Firm* — Lee IP Law, P.C.

(57) ABSTRACT

A light-emitting package including a substrate having pixel regions; first to third light-emitting chips on each of the pixel regions; and a molding layer on a top surface of the substrate, the molding layer covering the first to third light-emitting chips, wherein one of the first to third light-emitting chips emits light whose color is different from others of the first to third light-emitting chips, on pixel regions, the first to third light-emitting chips are arranged along a first direction, the first direction being parallel to the top surface of the substrate, a minimum interval between the first light-emitting chip and a top or side surface of the molding layer is different from a minimum interval between the second light-emitting chip and the top or side surface of the molding layer, the side surface of the molding layer intersects a second direction parallel to the top surface of the substrate.

20 Claims, 20 Drawing Sheets

(56) References Cited

U.S. PATENT DOCUMENTS

| | | | |
|---|---|---|---|
| 2019/0325803 A1* | 10/2019 | Chen | G06F 3/0412 |
| 2019/0355795 A1* | 11/2019 | Liu | H01L 27/3216 |
| 2020/0111403 A1* | 4/2020 | Kim | H01L 25/0753 |
| 2020/0373469 A1* | 11/2020 | Chen | H01L 33/62 |
| 2021/0111162 A1* | 4/2021 | Takeya | H01L 33/58 |

FOREIGN PATENT DOCUMENTS

| | | | |
|---|---|---|---|
| JP | 4400786 B2 | 1/2010 | |
| WO | WO2018/077058 | * 3/2018 | ............ 25/753 |
| WO | WO 2018/077058 A1 | 5/2018 | |

* cited by examiner

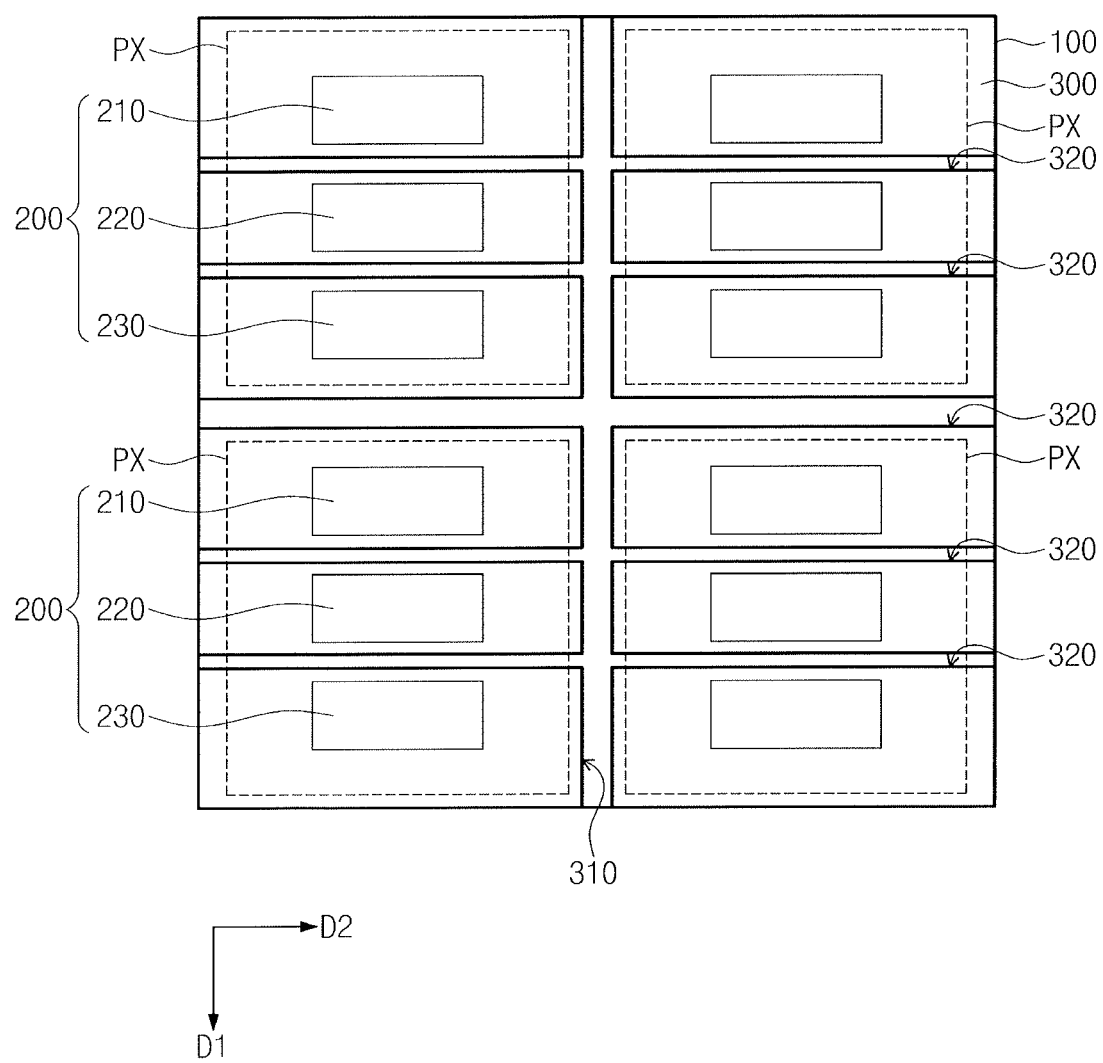

FIG. 5C
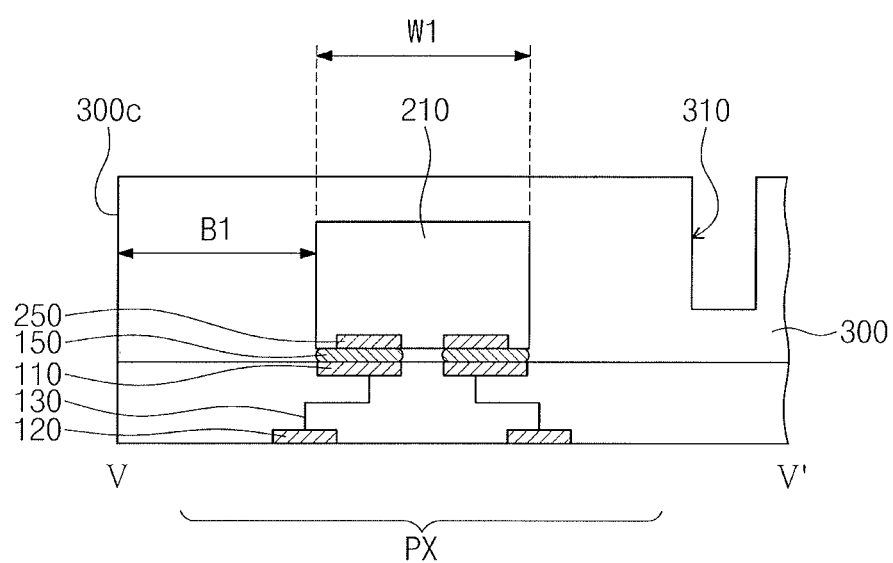
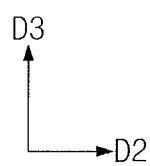

LIGHT-EMITTING PACKAGE AND DISPLAY DEVICE INCLUDING THE SAME

CROSS-REFERENCE TO RELATED APPLICATION

Korean Patent Application No. 10-2019-0109504, filed on Sep. 4, 2019, in the Korean Intellectual Property Office, and entitled: "Light-Emitting Package and Display Device Including the Same," is incorporated by reference herein in its entirety.

BACKGROUND

1. Field

Embodiments relate to a light-emitting package and a display device including the same.

2. Description of the Related Art

Light-emitting devices, such as light-emitting diodes, are apparatuses in which light is released or emitted from materials included therein. Light-emitting diodes emit light converted from energy due to recombination of electrons and holes contained in combined semiconductors. Light-emitting packages are provided to implement light-emitting devices to qualify for use in electronic products.

SUMMARY

The embodiments may be realized by providing a light-emitting package including a substrate that has a plurality of pixel regions; a first light-emitting chip, a second light-emitting chip, and a third light-emitting chip on each of the pixel regions of the substrate; and a molding layer on a top surface of the substrate, the molding layer covering the first light-emitting chip, the second light-emitting chip, and the third light-emitting chip, wherein one of the first light-emitting chip, the second light-emitting chip, and the third light-emitting chip is configured to emit light whose color is different from a color of light emitted from any of the others of the first light-emitting chip, the second light-emitting chip, and the third light-emitting chip, on each of the pixel regions, the first light-emitting chip, the second light-emitting chip, and the third light-emitting chip are arranged along a first direction, and the second light-emitting chip is between the first light-emitting chip and the third light-emitting chip, the first direction being parallel to the top surface of the substrate, a minimum interval between the first light-emitting chip and a top surface of the molding layer is different from a minimum interval between the second light-emitting chip and the top surface of the molding layer, or a minimum interval between the first light-emitting chip and a side surface of the molding layer is different from a minimum interval between the second light-emitting chip and the side surface of the molding layer, when viewed in plan perpendicular to the top surface of the substrate, the side surface of the molding layer intersects a second direction, and the second direction is parallel to the top surface of the substrate and intersects the first direction.

The embodiments may be realized by providing a light-emitting package including a substrate that has a plurality of pixel regions; a plurality of light-emitting chip groups on the pixel regions of the substrate, each of the light-emitting chip groups including a first light-emitting chip, a second light-emitting chip, and a third light-emitting chip that are spaced apart from each other; a plurality of connection terminals between the substrate and the first light-emitting chip, between the substrate and the second light-emitting chip, and between the substrate and the third light-emitting chip; and a molding layer on a top surface of the substrate, the molding layer covering the first light-emitting chip, the second light-emitting chip, and the third light-emitting chip, wherein the molding layer has a groove on a top surface thereof, one of the first light-emitting chip, the second light-emitting chip, and the third light-emitting chip is configured to emit light whose color is different from a color of light emitted from any of the others of the first light-emitting chip, the second light-emitting chip, and the third light-emitting chip, in each of the light-emitting chip groups, the first light-emitting chip, the second light-emitting chip, and the third light-emitting chip are arranged along a first direction parallel to the top surface of the substrate, a minimum distance between the first light-emitting chip and the top surface of the molding layer is different from a minimum distance between the second light-emitting chip and the top surface of the molding layer, or a minimum distance between the first light-emitting chip and a side surface of the molding layer is different from a minimum distance between the second light-emitting chip and the side surface of the molding layer, the side surface of the molding layer is perpendicular to a second direction, the top surface of the molding layer is perpendicular to a third direction, the second direction is parallel to the top surface of the substrate and intersects the first direction, and the third direction intersects the top surface of the substrate.

The embodiments may be realized by providing a display device including a board; and a plurality of light-emitting packages on a top surface of the board, wherein each of the light-emitting packages includes a substrate that has a plurality of pixel regions; a first light-emitting chip, a second light-emitting chip, and a third light-emitting chip that are on a top surface of the substrate, the first light-emitting chip, the second light-emitting chip, and the third light-emitting chip being on each of the pixel regions; and a molding layer on the top surface of the substrate, the molding layer covering the first light-emitting chip, the second light-emitting chip, and the third light-emitting chip, one of the first light-emitting chip, the second light-emitting chip, and the third light-emitting chip is configured to emit light whose color is different from a color of light emitted from any of the others of the first light-emitting chip, the second light-emitting chip, and the third light-emitting chip, in each of the light-emitting packages, the first light-emitting chip, the second light-emitting chip, and the third light-emitting chip are arranged along a first direction parallel to the top surface of the substrate, a minimum distance between the first light-emitting chip and a top surface of the molding layer is different from a minimum distance between the second light-emitting chip and the top surface of the molding layer, or a minimum distance between the first light-emitting chip and a side surface of the molding layer is different from a minimum distance between the second light-emitting chip and the side surface of the molding layer, the side surface of the molding layer is perpendicular to a second direction, the second direction is parallel to the top surface of the substrate and intersects the first direction, and the top surface of the molding layer is perpendicular to a third direction that intersects the top surface of the substrate.

BRIEF DESCRIPTION OF THE DRAWINGS

Features will be apparent to those of skill in the art by describing in detail exemplary embodiments with reference to the attached drawings in which:

FIG. 3 illustrates a plan view showing a light-emitting package according to some example embodiments.

FIG. 5C illustrates a cross-sectional view taken along line V-V' of FIG. 5A.

DETAILED DESCRIPTION

Figure 1A:
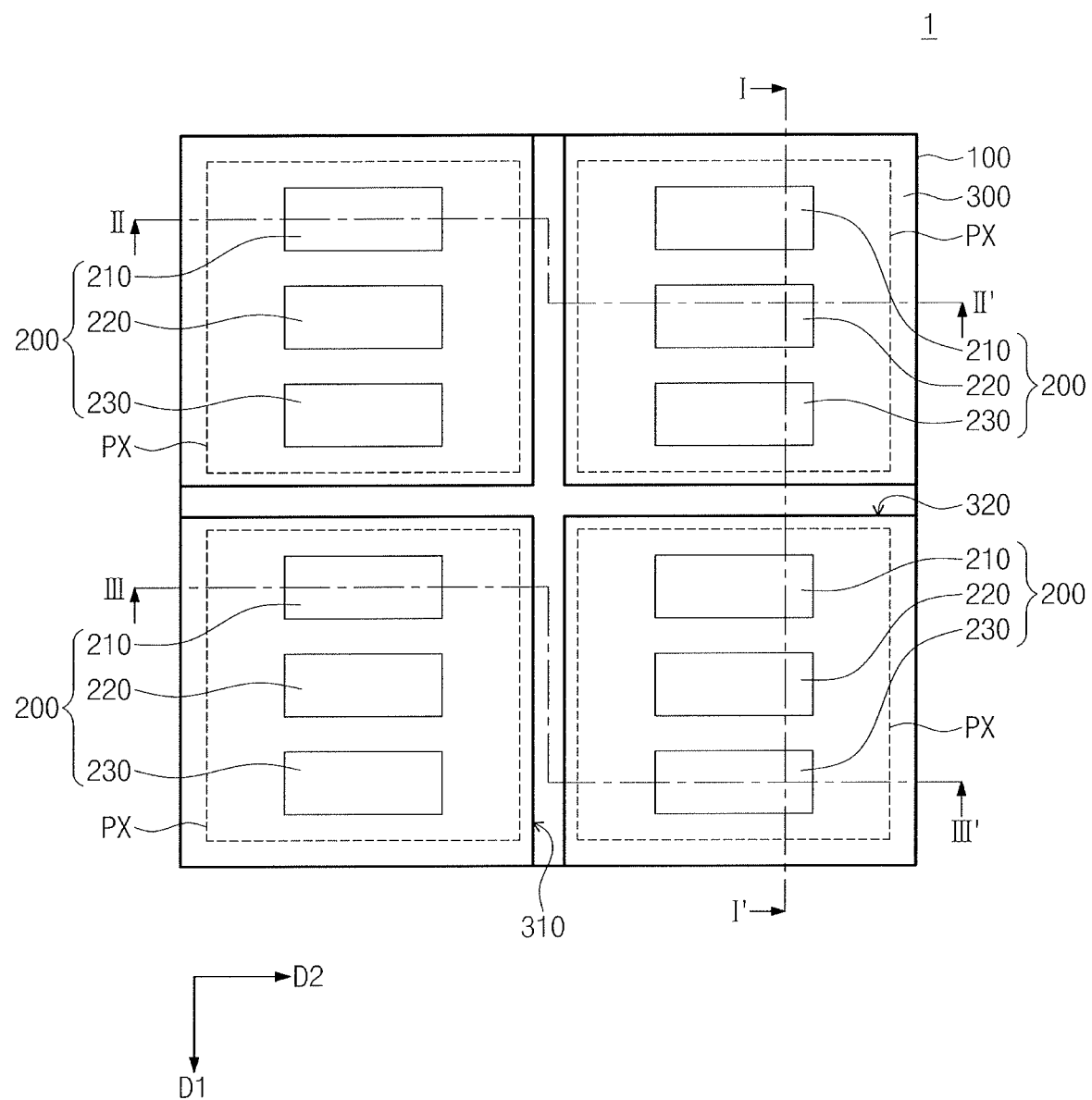
FIG. 1A illustrates a plan view showing a light-emitting package according to some example embodiments.
Figure 1B:
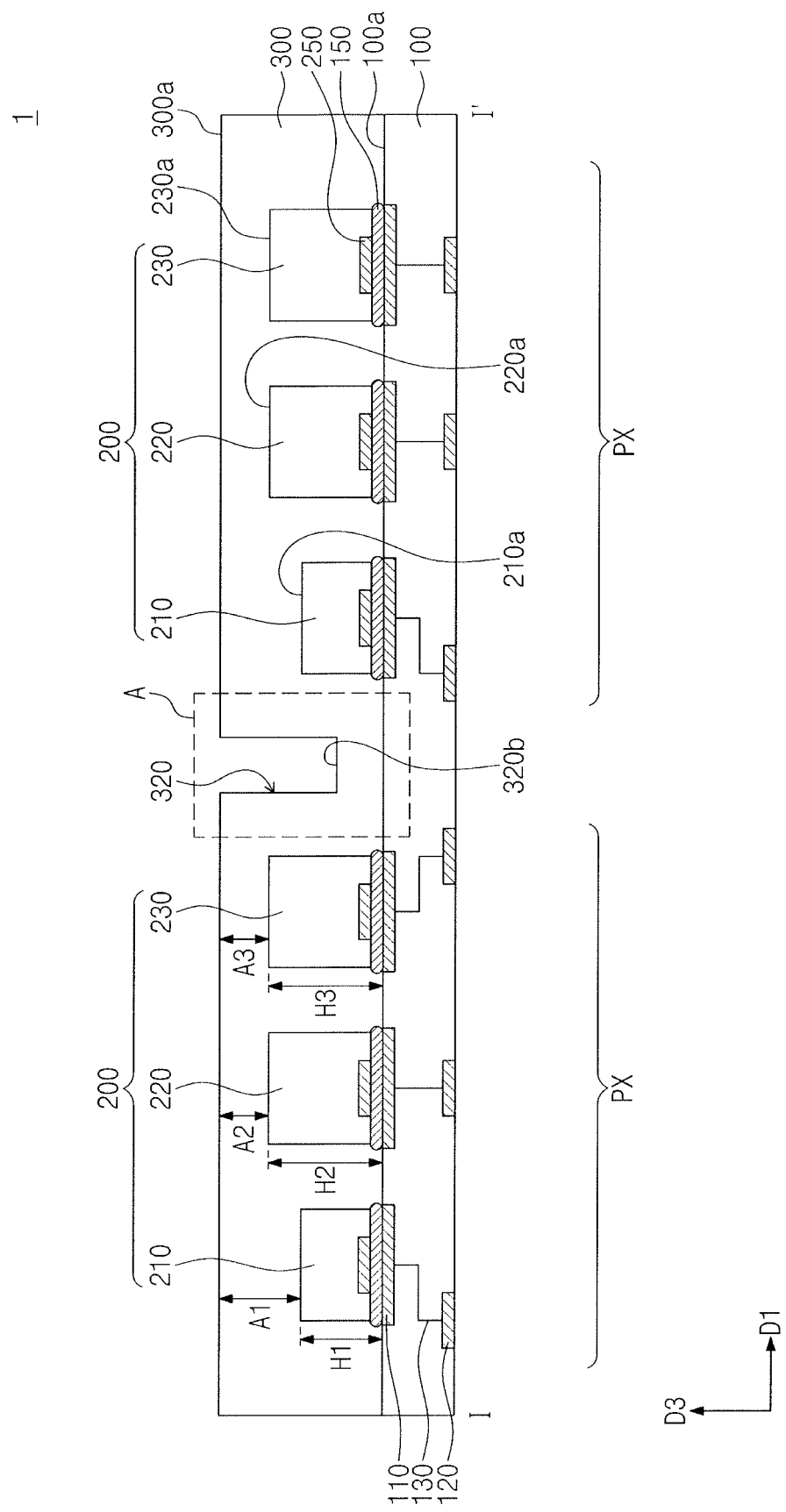
FIG. 1B illustrates a cross-sectional view taken along line I-I' of FIG. 1A.
Figure 1C:
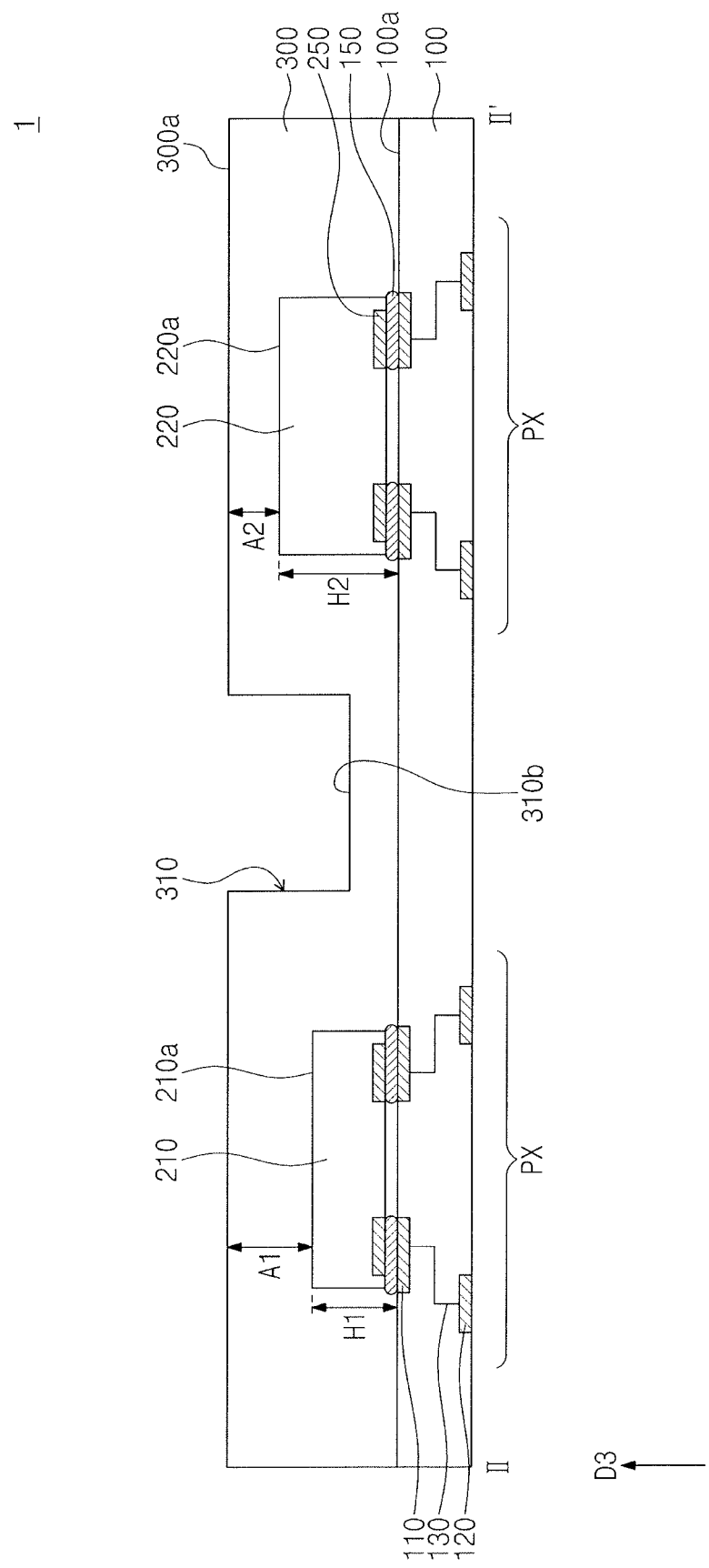
FIG. 1C illustrates a cross-sectional view taken along line II-II' of FIG. 1A.
Figure 1D:
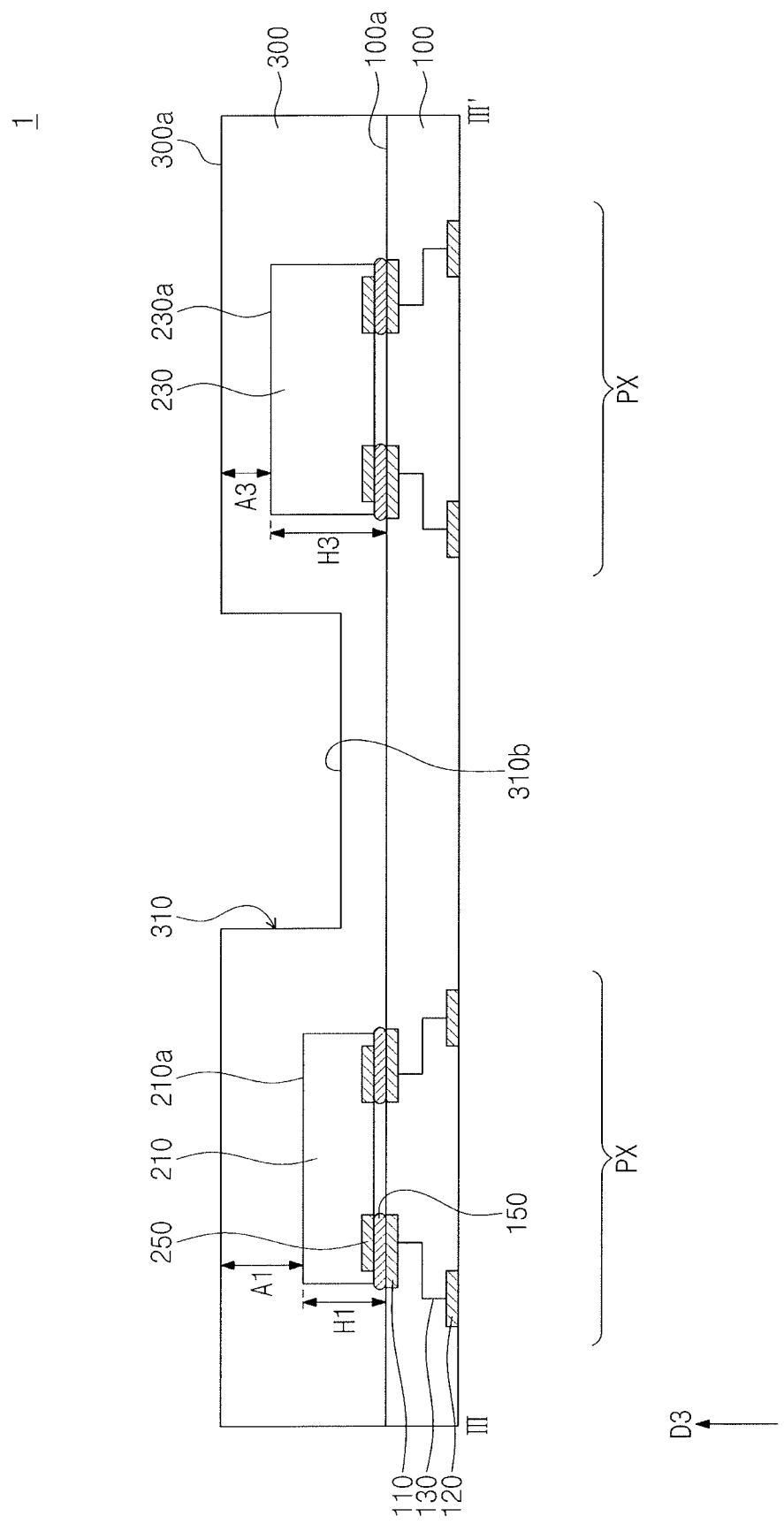
FIG. 1D illustrates a cross-sectional view taken along line III-II' of FIG. 1A.

FIG. 1A illustrates a plan view showing a light-emitting package according to some example embodiments. FIG. 1B illustrates a cross-sectional view taken along line I-I' of FIG. 1A. FIG. 1C illustrates a cross-sectional view taken along line II-II' of FIG. 1A. FIG. 1D illustrates a cross-sectional view taken along line III-III' of FIG. 1A.

Referring to FIGS. 1A, 1B, 1C, and 1D, a light-emitting package 1 may include a substrate 100, light-emitting chips 210, 220, and 230, and a molding layer 300. The substrate 100 may include, e.g., a printed circuit board (PCB). When viewed in plan, the substrate 100 may have a plurality of pixel regions PX. A pixel array may be constituted by or include the pixel regions PX of the substrate 100 that are arranged in row and column directions. The pixel regions PX may be arranged in columns parallel to a first direction D1 and in rows parallel to a second direction D2. In this description, the first direction D1 may be defined to refer to a direction parallel to a top surface 100a of the substrate 100. For example, the top surface 100a of the substrate 100 may be a surface facing the light-emitting chips 210, 220, and 230. The second direction D2 may be parallel to the top surface 100a of the substrate 100 and may intersect the first direction D1. A third direction D3 may intersect the top surface 100a of the substrate 100 (e.g., extending vertically from the top surface 100a of the substrate 100). For example, the third direction D3 may be substantially perpendicular to the first and second directions D1 and D2. In an implementation, the pixel regions PX may include two rows and two columns, or the numbers of the rows and columns may be variously changed. For example, the pixel regions PX may include three rows and three columns.

As shown in FIGS. 1B to 1D, upper pads 110 and lower pads 120 may be respectively on the top surface 100a and a bottom surface of the substrate 100 (e.g., surfaces of the substrate 100 that face outwardly oppositely in the third direction D3). The substrate 100 may be include connection lines 130 therein that are coupled to the upper pads 110 and the lower pads 120. One of the upper pads 110 may be connected through the connection line 130 to one of the lower pads 120. The connection lines 130, the upper pads 110, and the lower pads 120 may include a conductive material, e.g., metal. In an implementation, an upper passivation layer may be included on the top surface 100a of the substrate 100, and a lower passivation layer may be included on the bottom surface of the substrate 100. The upper passivation layer may expose the upper pads 110, and the lower passivation layer may expose the lower pads 120. The upper and lower passivation layers may include a dielectric material, e.g., a photo solder resist.

The light-emitting chips 210, 220, and 230 may be in or on the substrate 100. The light-emitting chips 210, 220, and 230 may include a first light-emitting chip 210, a second light-emitting chip 220, and a third light-emitting chip 230. The first, second, and third light-emitting chips 210, 220, and 230 may be flip-chip mounted on the top surface 100a of the substrate 100. Each of the first, second, and third light-emitting chips 210, 220, and 230 may have a chip terminal 250. The chip terminals 250 may be conductive pads or conductive patterns. The chip terminals 250 may be exposed on bottom surfaces of corresponding light-emitting chips 210, 220, and 230, and may be electrically connected to integrated circuits of corresponding light-emitting chips 210, 220, and 230. Connection terminals 150 may be correspondingly provided between the substrate 100 and the light-emitting chips 210, 220, and 230. The connection terminals 150 may be electrically connected to corresponding chip terminals 250 and to corresponding upper pads 110. The connection terminals 150 may include a solder, a bump, a ball grid array, or any combination thereof. The connection terminals 150 may include a conductive material, e.g., metal. The first, second, and third light-emitting chips 210, 220, and 230 may be electrically connected through the connection terminals 150 to the substrate 100. In this description, the phrase "electrically connected to the substrate 100" may mean "electrically connected to the connection line 130 in the substrate 100." The phrase "electrically connected to the light-emitting chips 210, 220, and 230 may mean "electrically connected to integrated circuits of the light-emitting chips 210, 220, and 230."

The first, second, and third light-emitting chips 210, 220, and 230 may have top surfaces 210a, 220a, and 230a and side surfaces, which top and side surfaces are light-emitting surfaces (e.g., the top surfaces 210a, 220a, and 230a may face away from the substrate 100 in the third direction D3). For example, light may be externally emitted through the top surfaces 210a, 220a, and 230a and the side surfaces of the light-emitting chips 210, 220, and 230. When the light-emitting chips 210, 220, and 230 are mounted in a wire bonding manner, the chip terminals 250 may be on the top surfaces 210a, 220a, and 230a of the light-emitting chips 210, 220, and 230, and bonding wires may be on the top surfaces 210a, 220a, and 230a and the side surfaces of the light-emitting chips 210, 220, and 230. In such cases, the bonding wires could block light emitted from the top surfaces 210a, 220a, and 230a and the side surfaces of the light-emitting chips 210, 220, and 230. The chip terminals 250 could block light emitted from the top surfaces 210a, 220a, and 230a of the light-emitting chips 210, 220, and 230. According to some embodiments, the chip terminals 250 may be on the bottom surfaces of the light-emitting chips 210, 220, and 230, and the connection terminals 150 may electrically connect the light-emitting chips 210, 220, and 230 to the substrate 100. For example, the connection terminals 150 may not be on the top surfaces 210a, 220a, and 230a or the side surfaces of the light-emitting chips 210, 220, and 230, and light emitted from the light-emitting chips 210, 220, and 230 may be satisfactorily externally emitted from the light-emitting package 1. For example, the light-emitting package 1 may increase in light efficiency and may emit light with uniform brightness.

The light-emitting chips 210, 220, and 230 may constitute or form light-emitting chip groups 200. The light-emitting chip groups 200 may be correspondingly on the pixel regions PX. Each of the light-emitting chip groups 200 may include the first light-emitting chip 210, the second light-emitting chip 220, and the third light-emitting chip 230. The first light-emitting chip 210, the second light-emitting chip 220, and the third light-emitting chip 230 may be configured to produce different colors from each other when the light-emitting package 1 operates in ON mode. The first light-emitting chip 210 may emit a first light with a first wavelength. The first light may correspond to light having a first color. The second light-emitting chip 220 may emit a second light with a second wavelength different from the first wavelength. The second light may have a second color, which is different from the first color. The third light-emitting chip 230 may emit a third light with a third wavelength. The third light may correspond to light having a third color, which is different from the first color and the second color. Among the first to third colors, one may be red, another may be green, and the other may be blue. In an implementation, the first color may be red, the second color may be green, and the third color may be blue. For brevity of description, the following will discuss an example in which the first color is red, the second color is green, and the third color is blue. In an implementation, the first color may be blue.

On each of the pixel regions PX, the first light-emitting chip 210, the second light-emitting chip 220, and the third light-emitting chip 230 may be arranged parallel to each other in the first direction D1. On each of the pixel regions PX, the second light-emitting chip 220 may be between the first light-emitting chip 210 and the third light-emitting chip 230 (e.g., along the first direction D1). When viewed in plan, the second light-emitting chip 220 may overlap a central part of each pixel region PX. The first light-emitting chip 210 and the third light-emitting chip 230 may overlap an edge part of each pixel region PX. On each pixel region PX, the edge part may be on or at opposite sides of the central part. The light-emitting chip groups 200 of a plurality of pixel regions PX may have the same planar arrangement. For example, a planar arrangement of the first, second, and third light-emitting chips 210, 220, and 230 included in one of the pixel regions PX may be substantially the same as or may correspond to that of the first, second, and third light-emitting chips 210, 220, and 230 included in another of the pixel regions PX. For example, the third light-emitting chip 230 included in one of two neighboring pixel regions PX in one column may neighbor (e.g., may be adjacent to or may face) the first light-emitting chip 210 included in the other of two neighboring pixel regions PX in one column (e.g., in the first direction D1). On the pixel regions PX that constitute one row, the first light-emitting chips 210 may be arranged parallel to the second direction D2, the second light-emitting chips 220 may be arranged parallel to the second direction D2, and the third light-emitting chips 230 may be arranged parallel to the second direction D2.

Each of the pixel regions PX may include the first light-emitting chip 210, the second light-emitting chip 220, and the third light-emitting chip 230, and when the light-emitting package 1 operates in ON mode, each of the pixel regions PX may emit light with a mixed light of the first light, the second light, and the third light. The mixed light may be a white light. In an implementation, the light-emitting package 1 may emit light with specific color (e.g., white) and color temperature. In an implementation, the light emitted from the light-emitting package 1 may have a color temperature that is substantially the same even when a viewing angle is changed.

The color temperature of light emitted from the light-emitting package 1 may be controlled by adjustment of current applied to the first, second, and third light-emitting chips 210, 220, and 230. For example, the current applied to the first light-emitting chip 210 may be different from that applied to the second light-emitting chip 220 and the third light-emitting chip 230. The current applied to the second light-emitting chip 220 may be different from that applied to the third light-emitting chip 230. If a mixed color of light emitted from the light-emitting package 1 were to be controlled only by adjustment of current applied to the light-emitting chips 210, 220, and 230, the color temperature of light emitted from the light-emitting package 1 could be changed based on the viewing angle. For example, the color temperature of light emitted from the light-emitting package 1 could be different from that of light related from a side surface of the light-emitting package 1. The color temperature of light emitted from the side surface of the light-emitting package 1 could be that of bluish white, and the color temperature of light emitted from a top surface of the light-emitting package 1 may not be that of bluish white. The top surface of the light-emitting package 1 may correspond to a top surface 300a of the molding layer 300 which will be discussed below.

In an implementation, levels (e.g., distances from the substrate 100 in the third direction D3) of the top surfaces 210a, 220a, and 230a of the first, second, and third light-emitting chips 210, 220, and 230 may be adjusted to help control the color temperature, depending on the viewing angle, of light emitted from the light-emitting package 1. For example, heights (H1, H2, and H3) of the light-emitting chips 210, 220, and 230 may be adjusted. The heights H1, H2, and H3 may refer to intervals or distances between the top surface 100a of the substrate 100 and corresponding top surfaces 210a, 220a, and 230a of the light-emitting chips 210, 220, and 230 (in the third direction D3).

The top surface 210a of the first light-emitting chip 210 may be at a different level from that of the top surface 220a of the second light-emitting chip 220. For example, the top surface 210a of the first light-emitting chip 210 may be at a lower level than that of the top surface 220a of the second light-emitting chip 220 (e.g., may be closer to the substrate 100 in the third direction D3). The height H1 of the first light-emitting chip 210 may be different from the height H2 of the second light-emitting chip 220. The height H1 of the first light-emitting chip 210 may be less than the height H2 of the second light-emitting chip 220. For example, a minimum interval A1 between the first light-emitting chip 210 and the top surface 300a of the molding layer 300 may be different from a minimum interval A2 between the second light-emitting chip 220 and the top surface 300a of the molding layer 300 (e.g., in the third direction D3). For example, the minimum interval (A1, A2, or A3) may be a distance in the third direction D3 between the top surface (210a, 220a, or 230a) of the light-emitting chip (210, 220, or 230) and the top surface 300a of the molding layer 300 (e.g., a distance between closest points of the top surface of the light-emitting chip and the top surface of the molding layer in the third direction D3). The top surface 300a of the molding layer 300 may intersect the third direction D3. The minimum interval A1 between the first light-emitting chip 210 and the top surface 300a of the molding layer 300 may correspond to a minimum interval between the top surface 210a of the first light-emitting chip 210 and the top surface 300a of the molding layer 300. The minimum interval A2 between the second light-emitting chip 220 and the top surface 300a of the molding layer 300 may correspond to a minimum interval between the top surface 220a of the second light-emitting chip 220 and the top surface 300a of the molding layer 300. The top surface 210a of the first light-emitting chip 210 may be at a different level from that of the top surface 230a of the third light-emitting chip 230. For example, the top surface 210a of the first light-emitting chip 210 may be at a lower level than that of the top surface 230a of the third light-emitting chip 230. The height H1 of the first light-emitting chip 210 may be different from the height H3 of the third light-emitting chip 230. The height H1 of the first light-emitting chip 210 may be less than the height H3 of the third light-emitting chip 230. A minimum interval A3 between the third light-emitting chip 230 and the top surface 300a of the molding layer 300 may be different from the minimum interval A1 between the first light-emitting chip 210 and the top surface 300a of the molding layer 300. The minimum interval A3 between the third light-emitting chip 230 and the top surface 300a of the molding layer 300 may correspond to a minimum interval between the top surface 230a of the third light-emitting chip 230 and the top surface 300a of the molding layer 300. The top surface 220a of the second light-emitting chip 220 may be at substantially the same level as that of the top surface 230a of the third light-emitting chip 230 (e.g., the top surface 220a of the second light-emitting chip 220 may be coplanar with the top surface 230a of the third light-emitting chip 230). The height H2 of the second light-emitting chip 220 may be substantially the same as the height H3 of the third light-emitting chip 230. In this description, the description of two components having the same height or planar area may include an error that can occur during process execution. In this description, the description of the same minimum interval between two components may include an error that can occur during process execution.

When the first light emitted from the first light-emitting chip 210 represents a red color, a decrease in level of the top surface 210a of the first light-emitting chip 210 may help reduce a difference in color temperature, depending on the viewing angle, of the light-emitting package 1. For example, when the top surface 210a of the first light-emitting chip 210 is provided at a low level (e.g., relatively closer to the substrate 100 in the third direction D3), an increase in magnitude of current applied to the first light-emitting chip 210 may increase brightness of the first light emitted from the side surface of the first light-emitting chip 210. It may thus be possible to help improve a phenomenon where a white light emitted from the side surface of the light-emitting package 1 appears as bluish white. The color temperature of white light emitted from the side surface of the light-emitting package 1 may be substantially the same as that of white light emitted from the top surface of the light-emitting package 1. For example, the color temperature of light emitted from the light-emitting package 1 may be substantially the same (e.g., uniform) even when the viewing angle is changed.

A planar area of the first light-emitting chip 210 may be substantially the same as that of the second light-emitting chip 220 and that of the third light-emitting chip 230. The planar area of the second light-emitting chip 220 may be substantially the same as that of the third light-emitting chip 230. In an implementation, the planar area of the first light-emitting chip 210 may be different from that of the second light-emitting chip 220 or the third light-emitting chip 230. In this description, the description of a planar area of a certain component may mean an area of a top surface of the certain component (e.g., when viewed in plan view along the third direction D3).

The substrate 100, on its top surface 100a, may include the molding layer 300, which may cover the first light-emitting chip 210, the second light-emitting chip 220, and the third light-emitting chip 230. The molding layer 300 may be on a plurality of the pixel regions PX of the substrate 100. The molding layer 300 may include a silicon dielectric material or an epoxy dielectric polymer. The molding layer 300 may further include an additive. The molding layer 300 may have transmittance of, e.g., 0.1% to 95% to light emitted from the first, second, and third light-emitting chips 210, 220, and 230.

A groove 310 and 320 may be on or in the top surface 300a of the molding layer 300. The groove 310 and 320 may include a first groove 310 and a second groove 320. As shown in FIG. 1A, the first groove 310 may extend parallel with the first direction D1. The second groove 320 may extend parallel with the second direction D2. The second groove 320 may be spatially connected to (e.g., in communication or continuous with) the first groove 310. Each of the first and second grooves 310 and 320 may be between adjacent two of the pixel regions PX. The first and second grooves 310 and 320 may define the pixel regions PX in the molding layer 300. Light emitted from two neighboring pixel regions PX may be divided by the first and second grooves 310 and 320. For example, the light-emitting package 1 may emit sharp light from each of the pixel regions PX. When viewed in plan, neither the first groove 310 nor the second groove 320 may overlap the light-emitting chips 210, 220, and 230. For example, light with uniform brightness may be emitted from the top surface of the light-emitting package 1. As shown in FIGS. 1B to 1D, the first and the second grooves 310 and 320 may have respective bottom surfaces 310b and 320b, each of which is at a lower level (e.g., closer to the substrate 100 in the third direction D3) than the top surfaces 220a and 230a of the second and third light-emitting chips 220 and 230. The bottom surfaces 310b and 320b of the first and second grooves 310 and 320 may be at a lower level than that of the top surface 210a of the first light-emitting chip 210. For example, when the light-emitting package 1 operates in ON mode, light emitted from the side surfaces of the first, second, and third light-emitting chips 210, 220, and 230 may be easily externally emitted through the first groove 310 or the second groove 320. As a result, the light-emitting package 1 may help increase in orientation angle of light emitted therefrom and may exhibit improved side light-emitting properties.

In an implementation, a blade may be used to partially remove the molding layer 300, thereby forming the first and second grooves 310 and 320. In an implementation, a molding frame with a protrusion may be used to form the first and second grooves 310 and 320 during the formation of the molding layer 300. In an implementation, one of the first and second grooves 310 and 320 may be omitted.

The first and second grooves 310 and 320 may have rectangular cross-sections. A substantially right angle may be provided between the bottom surface 310b and a sidewall of the first groove 310 and between the bottom surface 320b and a sidewall of the second groove 320. In an implementation, the first and second grooves 310 and 320 may be variously changed in cross-sectional shape.

FIGS. 2A to 2D illustrate enlarged cross-sectional views of section A in FIG. 1B, showing the second groove according to some example embodiments. A repeated description may be omitted below. A description of FIGS. 2A to 2D also refers to FIG. 1B.

Figure 2A:
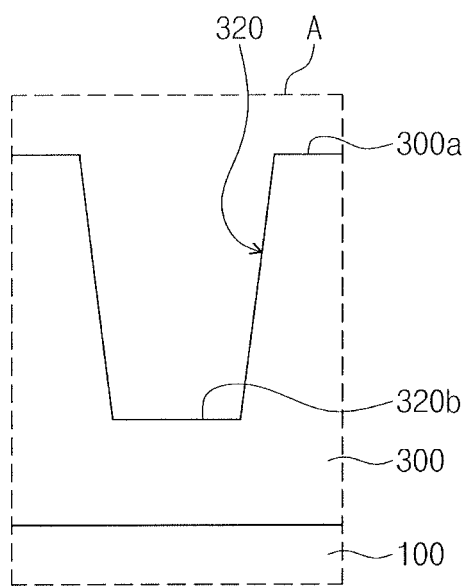
FIGS. 2A to 2D illustrate cross-sectional views showing a second groove according to some example embodiments.
Figure 2B:
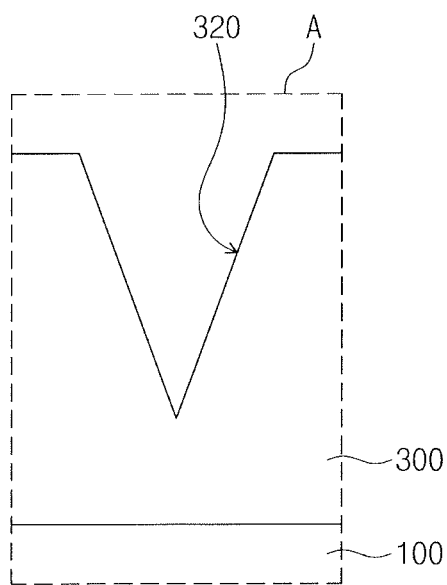
Figure 2C:
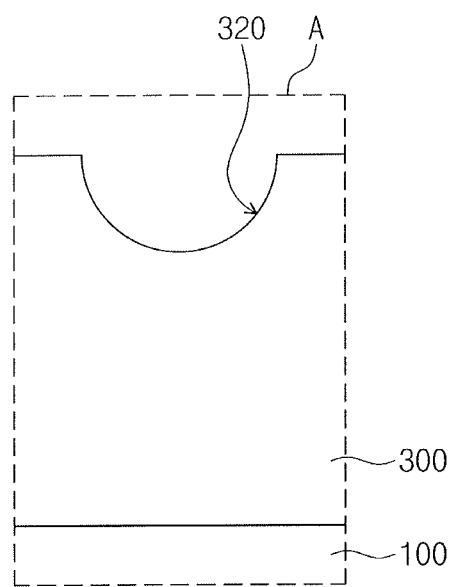
Figure 2D:
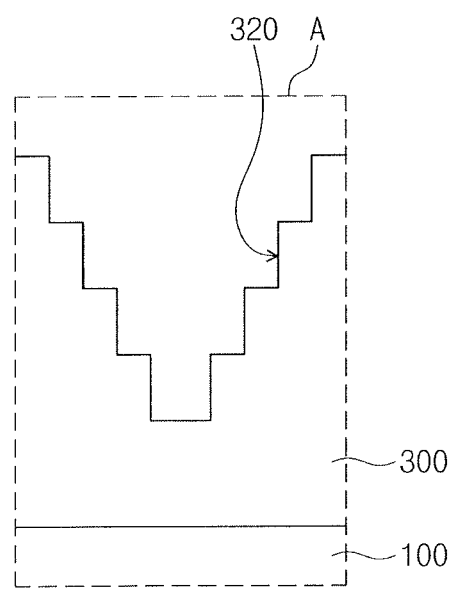

Referring to FIGS. 2A to 2D, the second groove 320 may have various cross-sections. In an implementation, as shown in FIG. 2A, an obtuse angle may be provided between the bottom surface 320b and the sidewall of the second groove 320, and a width at the bottom surface 320b of the second groove 320 may be less than a width of the second groove 320 at the top surface 300a of the molding layer 300 (e.g., as measured in the first direction D1). In an implementation, as illustrated in FIG. 2B, the second groove 320 may have a triangular cross-section. In an implementation, as depicted in FIG. 2C, the second groove 320 may have a semicircular cross-section. For example, the second groove 320 may have a rounded bottom surface and a rounded sidewall. In an implementation, as illustrate in FIG. 2D, the second groove 320 may have a stepwise cross-section.

Even when the cross-sectional shape of the second groove 320 is changed as shown in FIGS. 2A to 2D, the bottom surface of the second groove 320 may be at a lower level that those of the top surfaces 220a and 230a of the second and third light-emitting chips 220 and 230.

In an implementation, the cross-section of the first groove 310 may be variously changed as described in the examples of the second groove 320 in FIGS. 2A to 2D.

FIG. 3 illustrates a plan view showing a light-emitting package according to some example embodiments. A repeated description may be omitted below. A description of FIG. 3 also refers to FIG. 1B to 1D.

Referring to FIG. 3, a light-emitting package 1A may include the substrate 100, the light-emitting chip groups 200, and the molding layer 300. Each of the light-emitting chip groups 200 may include the first light-emitting chip 210, the second light-emitting chip 220, and the third light-emitting chip 230. The first groove 310 and the second groove 320 may be provided on the top surface 300a of the molding layer 300.

The second groove 320 may be provided in plural. For example, at least one of the second grooves 320 may be between two adjacent pixel regions PX (e.g., two adjacent pixel regions PX that are spaced apart in the first direction D1). Other one of the second grooves 320 may overlap the pixel regions PX. The second grooves 320 may be between corresponding two adjacent ones of the light-emitting chips 210, 220, and 230. When viewed in plan, the second grooves 320 may overlap none of the light-emitting chips 210, 220, and 230. The second grooves 320 may be spatially connected to the first groove 310. The second grooves 320 may have the same or different widths. The widths of the second grooves 320 may be measured in the first direction D1.

The first groove 310 may have a planar shape substantially the same as that discussed above in FIG. 1A. In an implementation, a plurality of first grooves 310 may be provided. In an implementation, the first and second grooves 310 and 320 may have their planar shapes that may be variously changed. The substrate 100, the first, second, and third light-emitting chips 210, 220, and 230, and the molding layer 300 may be substantially the same as those discussed above with reference to FIG. 1A to 1D. The first and second grooves 310 and 320 may have the same cross-sections as those discussed in FIGS. A to 1D and 2A to 2D.

FIG. 4A illustrates a cross-sectional view taken along line I-I' of FIG. 1A, showing a light-emitting package according to some example embodiments. A repeated description may be omitted below.

Figure 4:
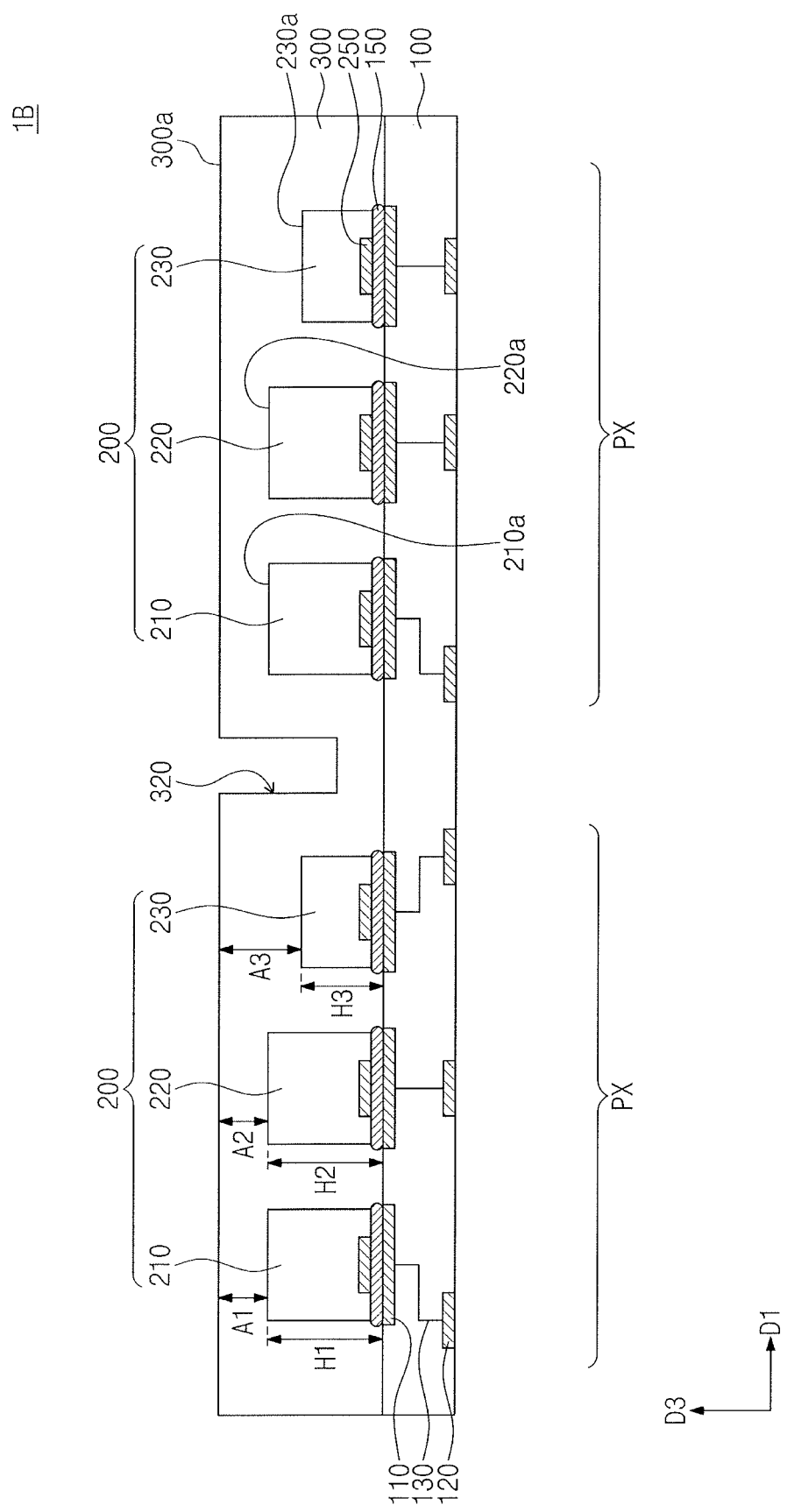
FIG. 4 illustrates a cross-sectional view showing a light-emitting package according to some example embodiments.

Referring to FIGS. 1A and 4, a light-emitting package 1B may include the substrate 100, the light-emitting chip groups 200, and the molding layer 300. The substrate 100, the light-emitting chip groups 200, and the molding layer 300 may be substantially the same as those discussed above with reference to FIGS. 1A to 1D. For example, a planar arrangement and disposition of the light-emitting chip groups 200 may be the same as that discussed above. Each of the light-emitting chip groups 200 may include the first light-emitting chip 210, the second light-emitting chip 220, and the third light-emitting chip 230.

In an implementation, the top surface 230a of the third light-emitting chip 230 may be at a different level from that of the top surface 210a of the first light-emitting chip 210 and that of the top surface 220a of the second light-emitting chip 220. For example, the top surface 230a of the third light-emitting chip 230 may be at a lower level than that of the top surface 210a of the first light-emitting chip 210 and that of the top surface 220a of the second light-emitting chip 220. The height H3 of the third light-emitting chip 230 may be less than the height H1 of the first light-emitting chip 210 and the height H2o f the second light-emitting chip 220. The minimum interval A3 between the third light-emitting chip 230 and the top surface 300a of the molding layer 300 may be different from the minimum interval A1 between the first light-emitting chip 210 and the top surface 300a of the molding layer 300. For example, the minimum interval A3 between the third light-emitting chip 230 and the top surface 300a of the molding layer 300 may be less than the minimum interval A1 between the first light-emitting chip 210 and the top surface 300a of the molding layer 300. The minimum interval A3 between the third light-emitting chip 230 and the top surface 300a of the molding layer 300 may be different from the minimum interval A2 between the second light-emitting chip 220 and the top surface 300a of the molding layer 300. An adjustment of the level of the top surface 230a of the third light-emitting chip 230 may facilitate emission of light from the light-emitting package 1B whose color temperature, depending on the viewing angle, is substantially uniform. For example, it may be possible to help improve a phenomenon where a color temperature of white light emitted from a side surface of the light-emitting package 1B appears as reddish white. In this case, magnitude of current applied to the third light-emitting chip 230 may further be adjusted.

The top surface 210a of the first light-emitting chip 210 may be at substantially the same level as that of the top surface 220a of the second light-emitting chip 220. For example, the height H1 of the first light-emitting chip 210 may be substantially the same as the height H2 of the second light-emitting chip 220. The minimum interval A1 between the first light-emitting chip 210 and the top surface 300a of the molding layer 300 may be substantially the same as the minimum interval A2 between the second light-emitting chip 220 and the top surface 300a of the molding layer 300. In an implementation, the top surface 210a of the first light-emitting chip 210 may be located at a different level from that of the top surface 220a of the second light-emitting chip 220.

A planar area of the third light-emitting chip 230 may be substantially the same as that of the first light-emitting chip 210 and that of the second light-emitting chip 220. The planar area of the first light-emitting chip 210 may be substantially the same as that of the third light-emitting chip 230.

In an implementation, the planar area of the third light-emitting chip 230 may be adjusted to cause the light-emitting package 1B to emit light whose color temperature is uniform, which color temperature depends on the viewing angle. The planar area of the third light-emitting chip 230 may be different from that of the first light-emitting chip 210 and that of the second light-emitting chip 220.

Figure 5A:
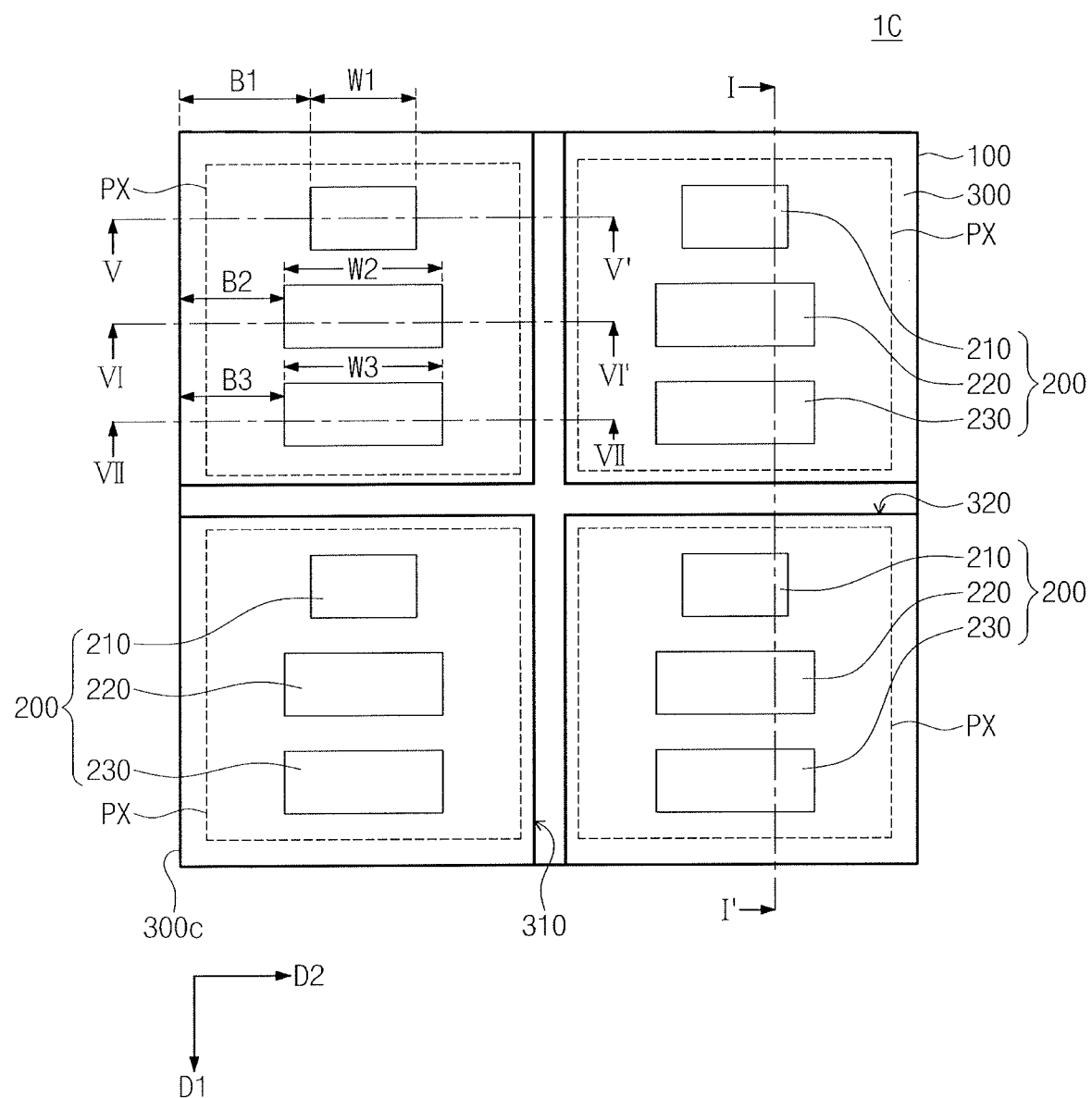
FIG. 5A illustrates a plan view showing a light-emitting package according to some example embodiments.
Figure 5B:
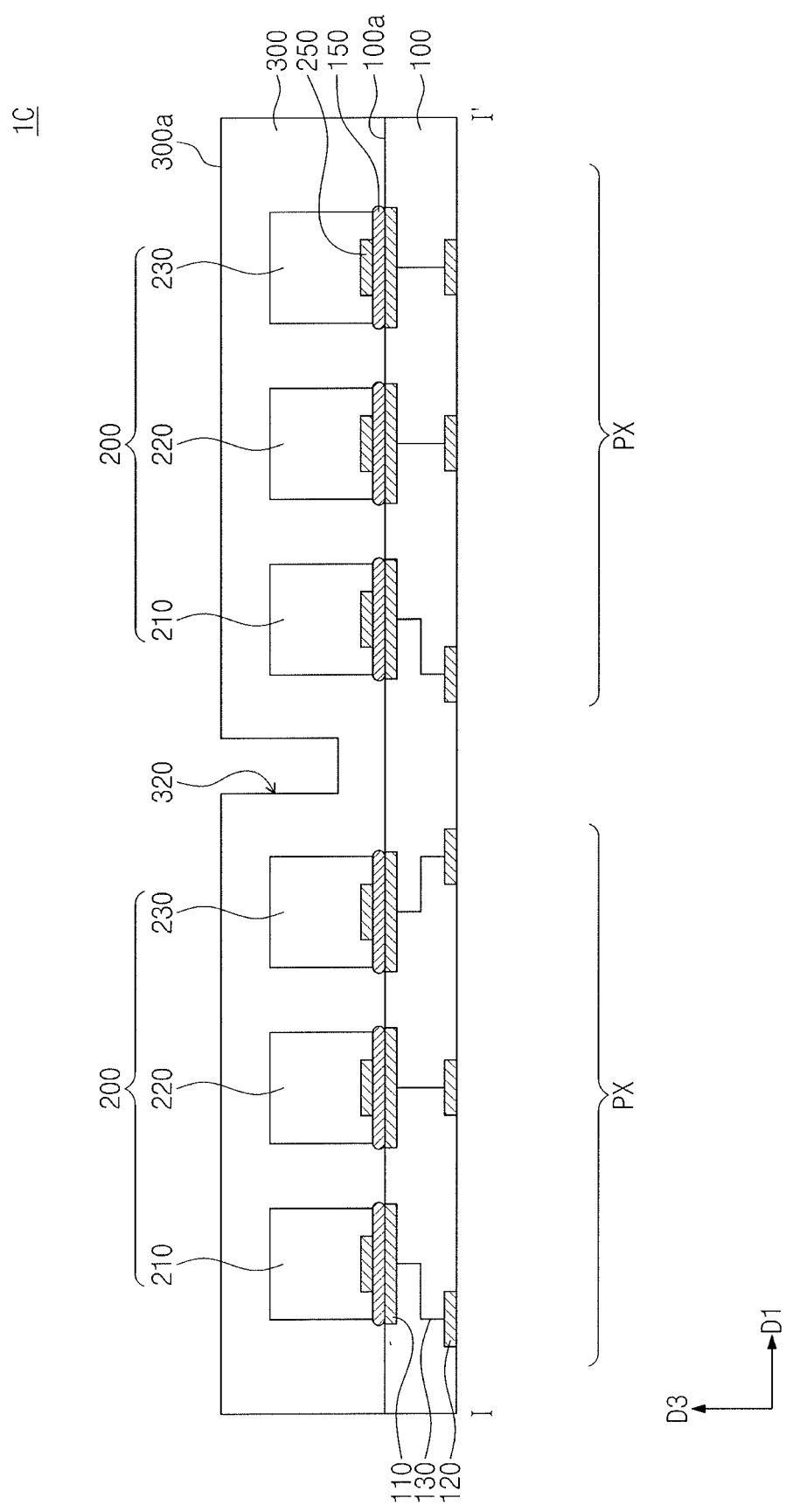
FIG. 5B illustrates a cross-sectional view taken along line I-I' of FIG. 5A.
Figure 5D:
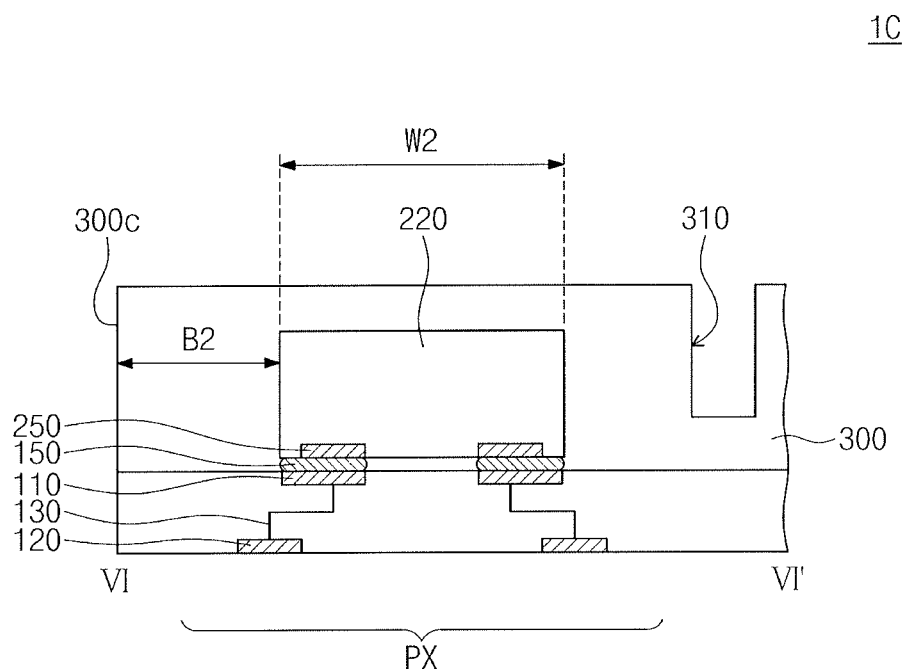
FIG. 5D illustrates a cross-sectional view taken along line VI-VI' of FIG. 5A.
Figure 5E:
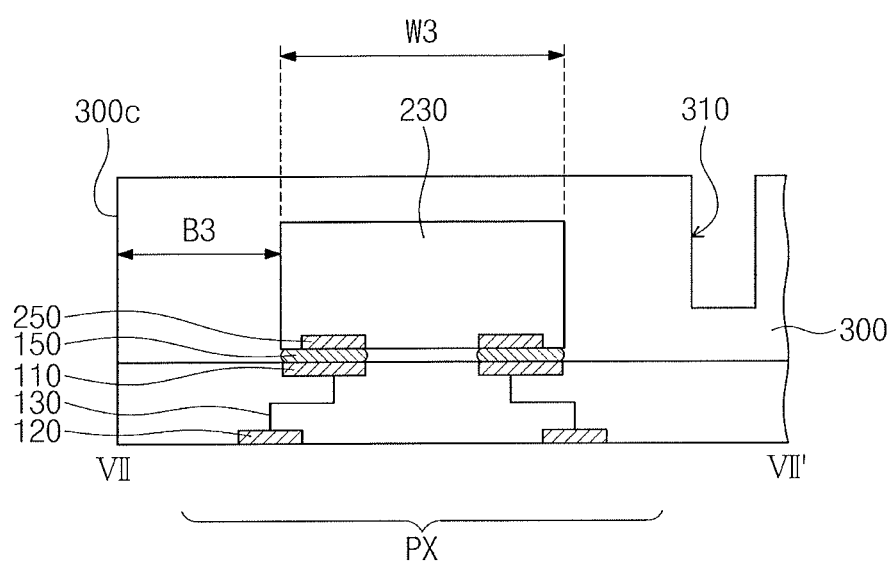
FIG. 5E illustrates a cross-sectional view taken along line VII-VII' of FIG. 5A.

FIG. 5A illustrates a plan view showing a light-emitting package according to some example embodiments. FIG. 5B illustrates a cross-sectional view taken along line I-I' of FIG. 5A. FIG. 5C illustrates a cross-sectional view taken along line V-V' of FIG. 5A. FIG. 5D illustrates a cross-sectional view taken along line VI-VI' of FIG. 5A. FIG. 5E illustrates a cross-sectional view taken along line VII-VII' of FIG. 5A. A repeated description may be omitted below.

Referring to FIGS. 5A, 5B, 5C, 5D, and 5E, a light-emitting package 1C may include the substrate 100, the light-emitting chip groups 200, and the molding layer 300. The substrate 100 and the molding layer 300 may be substantially the same as those discussed above in FIG. 1A to 1D. The first light-emitting chip 210, the second light-emitting chip 220, and the third light-emitting chip 230 may have substantially the same arrangement, light-emitting properties, and function as those discussed above. For example, on each of the pixel regions PX, the first light-emitting chip 210, the second light-emitting chip 220, and the third light-emitting chip 230 may be arranged parallel to each other in the first direction D1. The first light-emitting chip 210, the second light-emitting chip 220, and the third light-emitting chip 230 may be configured to emit light of different colors from each other when the light-emitting package 1C operates in ON mode.

The first light-emitting chip 210 may have a first width W1 (in the second direction D2). The second light-emitting chip 220 may have a second width W2 (in the second direction D2). The second width W2 may be different from the first width W1. The third light-emitting chip 230 may have a third width W3 (in the second direction D2). The third width W3 may be different from the first width W1. The third width W3 may be substantially the same as the second width W2. In this description, the first, second, and third widths W1, W2, and W3 respectively of the first, second, and third light-emitting chips 210, 220, and 230 may be values measured in the second direction D2.

A minimum interval B1 between the first light-emitting chip 210 and a first side surface 300c of the molding layer 300 (e.g., in the second direction D2) may be different from a minimum interval B2 between the second light-emitting chip 220 and the first side surface 300c of the molding layer 300 (in the second direction D2). For example, the minimum interval B1 between the first light-emitting chip 210 and the first side surface 300c of the molding layer 300 may be greater than the minimum interval B2 between the second light-emitting chip 220 and the first side surface 300c of the molding layer 300. For example, the first side surface 300c of the molding layer 300 may intersect the second direction D2.

The minimum interval B1 between the first light-emitting chip 210 and the first side surface 300c of the molding layer 300 may be different from a minimum interval B3 between the third light-emitting chip 230 and the first side surface 300c of the molding layer 300. For example, the minimum interval B1 between the first light-emitting chip 210 and the first side surface 300c of the molding layer 300 may be greater than the minimum interval B3 between the third light-emitting chip 230 and the first side surface 300c of the molding layer 300.

In an implementation, the minimum interval B2 between the second light-emitting chip 220 and the first side surface 300c of the molding layer 300 may be substantially the same as the minimum interval B3 between the third light-emitting chip 230 and the first side surface 300c of the molding layer 300. In an implementation, the minimum interval B2 between the second light-emitting chip 220 and the first side surface 300c of the molding layer 300 may be different from the minimum interval B3 between the third light-emitting chip 230 and the first side surface 300c of the molding layer 300.

The minimum intervals B, B2, and B3 between the first side surface 300c of the molding layer 300 and the first, second, and third light-emitting chips 210, 220, and 230 may be adjusted to help reduce a difference in color temperature, depending on the viewing angle, of light emitted from the light-emitting package 1C.

As shown in FIG. 5B, the first light-emitting chip 210 may have a top surface at substantially the same level as that of top surfaces of the second and third light-emitting chips 220 and 230. The top surface of the second light-emitting chip 220 may be at substantially the same level as that of the top surface of the third light-emitting chip 230. In an implementation, as discussed with reference to FIGS. 1B to 1D, the top surface of the first light-emitting chip 210 may be located at a different level from that of the top surface of the second light-emitting chip 220 and that of the top surface of the third light-emitting chip 230.

Figure 6A:
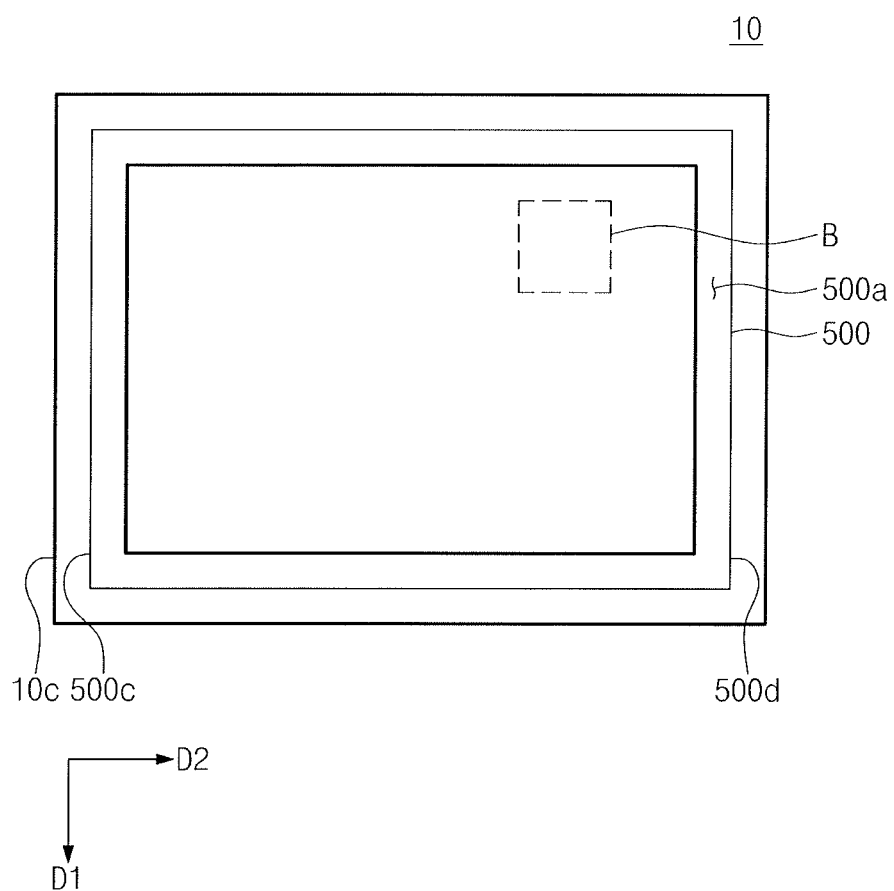
FIG. 6A illustrates a plan view showing a display device according to some example embodiments.
Figure 6B:
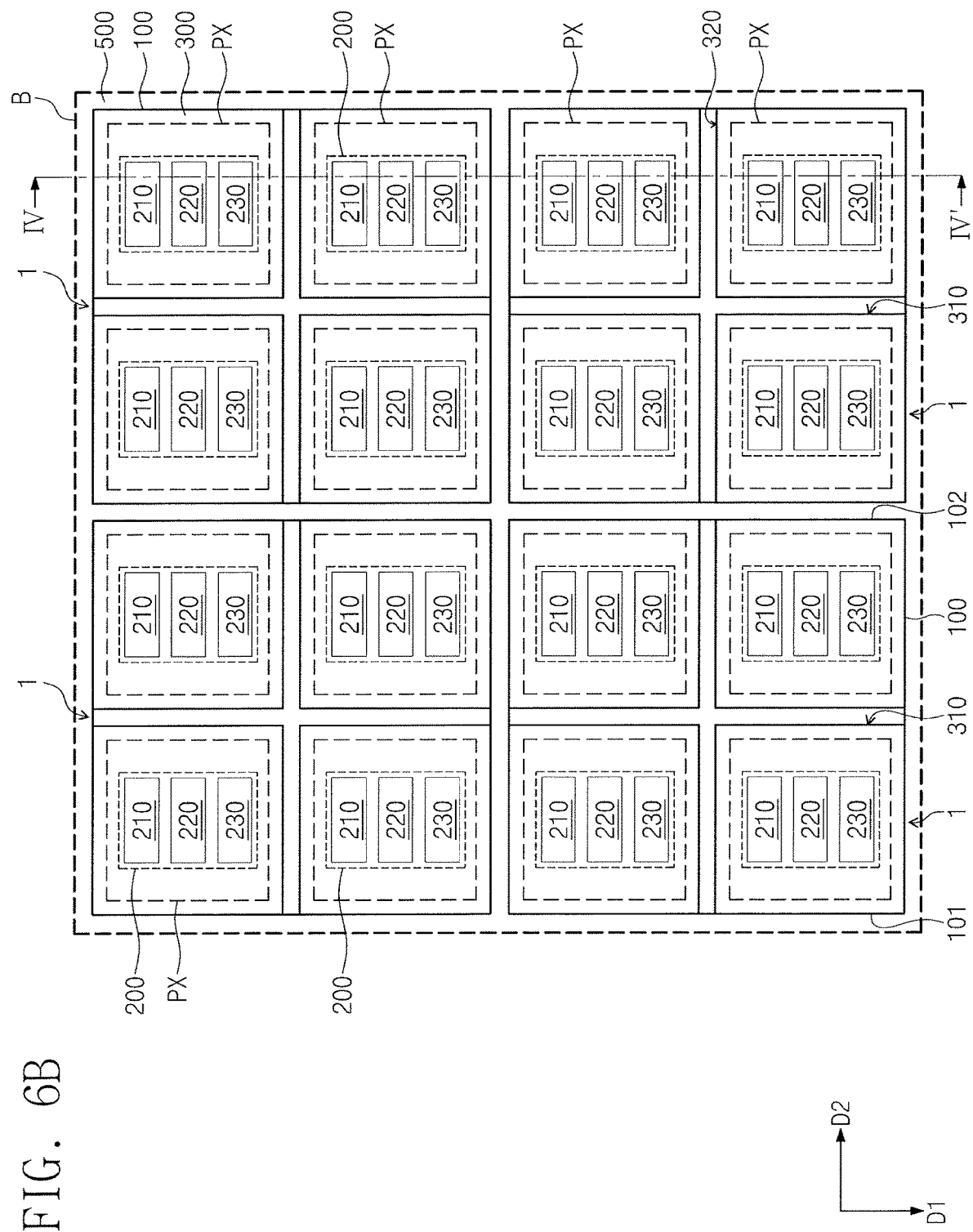
FIG. 6B illustrates an enlarged view showing section B of FIG. 6A.
Figure 6C:
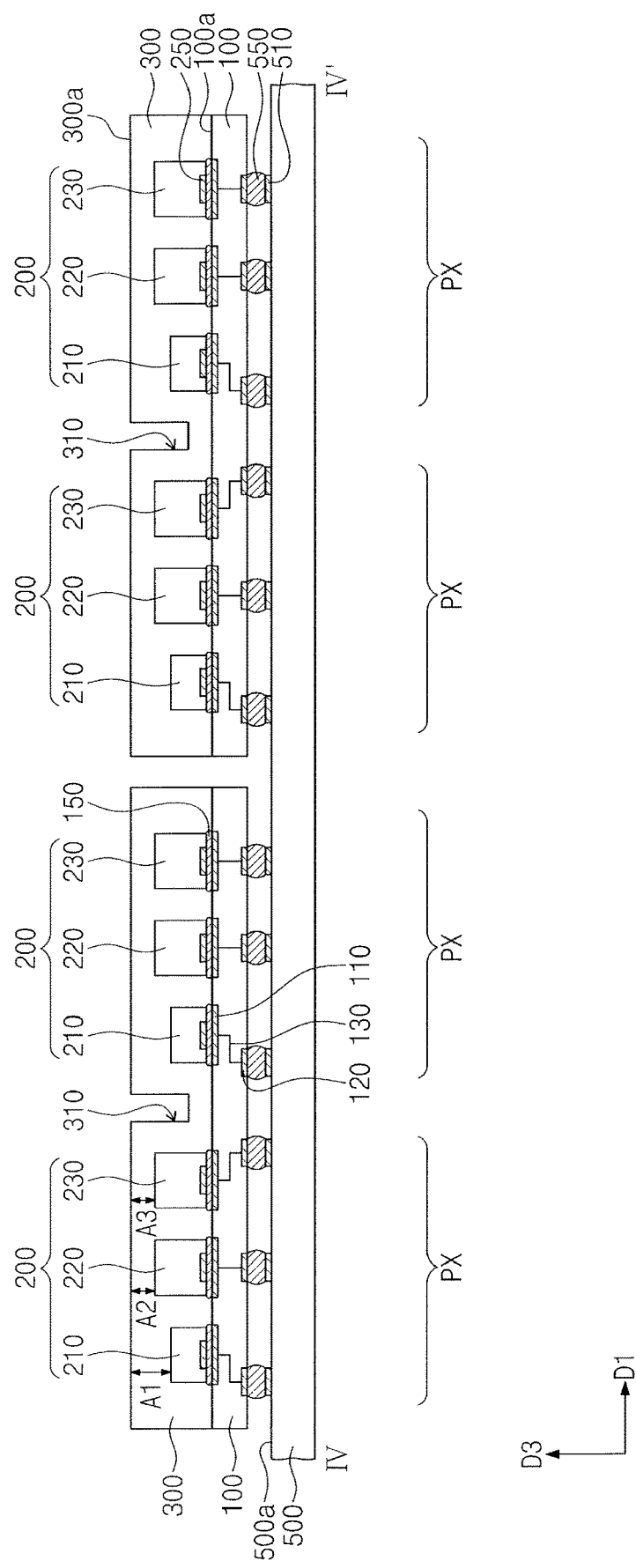
FIG. 6C illustrates a cross-sectional view taken along line IV-IV' of FIG. 6B.

FIG. 6A illustrates a plan view showing a display device according to some example embodiments. FIG. 6B illustrates an enlarged view showing section B of FIG. 6A. FIG. 6C illustrates a cross-sectional view taken along line IV-IV' of FIG. 6B. A duplicate description will be omitted below.

Referring to FIGS. 6A, 6B, and 6C, a display device 10 may have a side surface 10c that is parallel to a first direction D1 and intersects a second direction D2. The display device 10 may include a board 500 and a plurality of light-emitting packages 1. The board 500 may include, e.g., a printed circuit board. The board 500 may have a top surface 500a, a first side surface 500c, and a second side surface 500d. The top surface 500a of the board 500 may be parallel to the first direction D1 and the second direction D2. Conductive pads 510 may be on the top surface 500a of the board 500. The conductive pads 510 may be electrically connected to an external device through inner connection lines in the board 500. The first side surface 500c and the second side surface 500d may neighbor or abut the top surface 500a of the board 500. The second side surface 500d may face (e.g., may be parallel with) the first side surface 500c of the board 500.

The first side surface 500c and the second side surface 500d of the board 500 may be parallel with the side surface 10c of the display device 10.

As shown in FIGS. 6B and 6C, the light-emitting packages 1 may be mounted on the board 500. The light-emitting packages 1 may be arranged in columns parallel to the first direction D1 and rows parallel to the second direction D2. The light-emitting packages 1 may be spaced apart from each other in the first direction D1 and the second direction D2. Each of the light-emitting packages 1 may be substantially the same as the light-emitting package 1 discussed above in FIGS. 1A to 1D. For example, each of the light-emitting packages 1 may include the substrate 100, the light-emitting chip groups 200, and the molding layer 300, and each of the light-emitting chip groups 200 may include the first light-emitting chip 210, the second light-emitting chip 220, and the third light-emitting chip 230. On the top surface 300a of the molding layer 300, a user may face the display device 10.

As shown in FIG. 6C, the board 500 and the light-emitting packages 1 may have connectors 550 therebetween that couple the conductive pads 510 to corresponding lower pads 120. For example, the first, second, and third light-emitting chips 210, 220, and 230 may be electrically connected through the substrate 100 to the board 500. The connectors 550 may include, e.g., a solder ball, a bump, a ball grid array, or any combination thereof.

In an implementation, on each of the pixel regions PX, the first, second, and third light-emitting chips 210, 220, and 230 may be aligned with each other in the first direction D1. When the display device 10 operates, each of the pixel regions PX may emit light in which a first light, a second light, and a third light are mixed with each other, and the mixed light may be a white light. The substrate 100 may have a first side surface 101 and a second side surface 102. The first and second side surfaces 101 and 102 of the substrate 100 may be parallel to one another and may extend along the first direction D1, and may neighbor or abut a top surface 100a of the substrate 100. The first and second side surfaces 101 and 102 of the substrate 100 may be parallel to the side surface 10c of the display device 10 illustrated in FIG. 6A. On each of the pixel regions PX, neither the second light-emitting chip 220 nor the third light-emitting chip 230 may be between the first side surface 101 of the substrate 100 and the side surface of the first light-emitting chip 210, between the second side surface 102 of the substrate 100 and the side surface of the first light-emitting chip 210, and between the first groove 310 and the side surface of the first light-emitting chip 210. A first light emitted from the side surface of the first light-emitting chip 210 may be externally emitted from the display device 10, without being interrupted by the second light-emitting chip 220 or the third light-emitting chip 230. Likewise, neither the first light-emitting chip 210 nor the third light-emitting chip 230 may be between the first side surface 101 of the substrate 100 and the side surface of the second light-emitting chip 220, between the second side surface 102 of the substrate 100 and the side surface of the second light-emitting chip 220, and between the first groove 310 and the side surface of the second light-emitting chip 220. A second light emitted from the side surface of the second light-emitting chip 220 may be externally emitted from the display device 10, without being interrupted by the first light-emitting chip 210 or the third light-emitting chip 230. Neither the first light-emitting chip 210 nor the second light-emitting chip 220 may be between the first side surface 101 of the substrate 100 and the side surface of the third light-emitting chip 230, between the second side surface 102 of the substrate 100 and the side surface of the third light-emitting chip 230, and between the first groove 310 and the side surface of the third light-emitting chip 230. A third light emitted from the side surface of the third light-emitting chip 230 may be externally emitted from the display device 10, without being interrupted by the first light-emitting chip 210 or the second light-emitting chip 220. The first groove 310 may be provided, and the first light, the second light, and the third light emitted from the side surfaces of the first, second, and third light-emitting chips 210, 220, and 230 may be externally emitted at high efficiency from the display device 10. When the display device 10 operates in ON mode, the color temperature of white light emitted from the top surface of each of the light-emitting packages 1 may be substantially the same as that of white light emitted from the side surface of a corresponding one of each of the light-emitting packages 1. In this case, the side surface of the light-emitting package 1 may intersect the second direction D2. Even when a user moves in the second direction D2 or in a direction opposite to the second direction D2, the user may recognize a white light whose color temperature is substantially the same as that of white light from the display device 10.

When the display device 10 operates in OFF mode, an external light may be reflected from or by the top surface of the display device 10 and then recognized to users. In this case, the light reflected from or by the display device 10 may have low contrast. In fabricating the light-emitting packages 1, there could be occurrence of minor errors, slight differences in material of the molding layer 300, or fine gaps between the light-emitting packages 1. For example, a difference in contrast could occur between light reflected from the light-emitting packages 1. According to some embodiments, the first groove 310 and the second groove 320 may be formed on the top surface 300a of the molding layer 300. The first groove 310 and the second groove 320 may help compensate the contrast difference caused by the light-emitting packages 1. For example, when the display device 10 operates in OFF mode, light reflected from or by the display device 10 may exhibit uniform contrast.

In an implementation, the board 500 may include the light-emitting package 1A of FIG. 3 or the light-emitting package 1B of FIG. 4 thereon, with the result that the display device 10 may be fabricated.

Figure 7A:
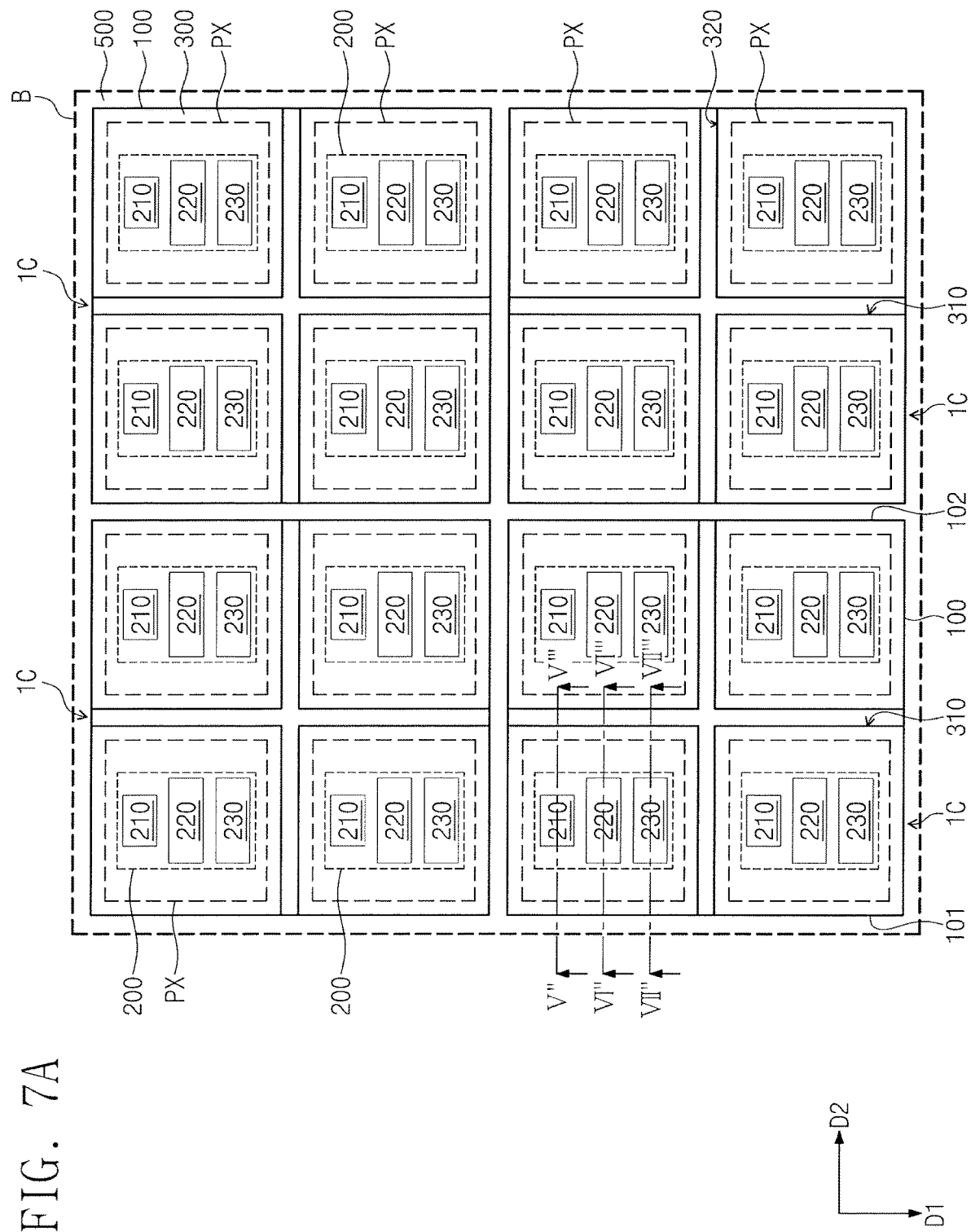
FIG. 7A illustrates a plan view showing a display device according to some example embodiments.
Figure 7B:
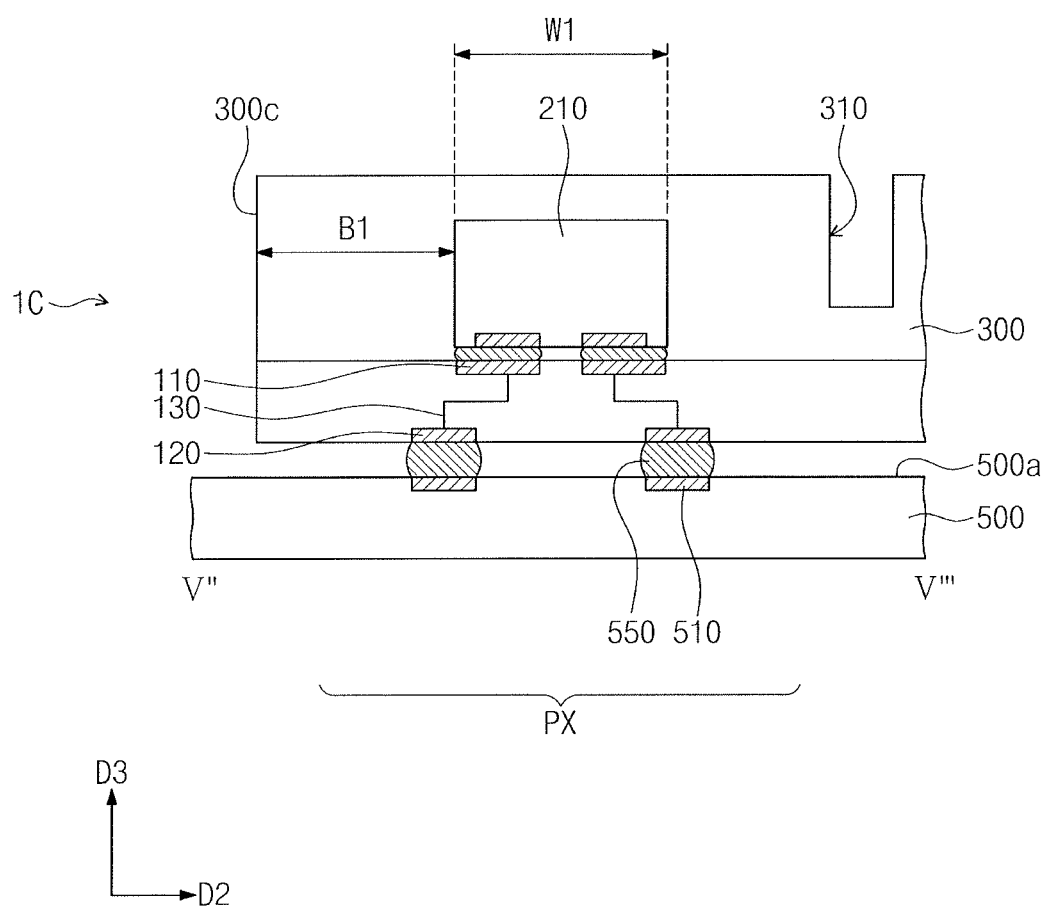
FIG. 7B illustrates a cross-sectional view taken along line IV"-IV'" of FIG. 7A.
Figure 7C:
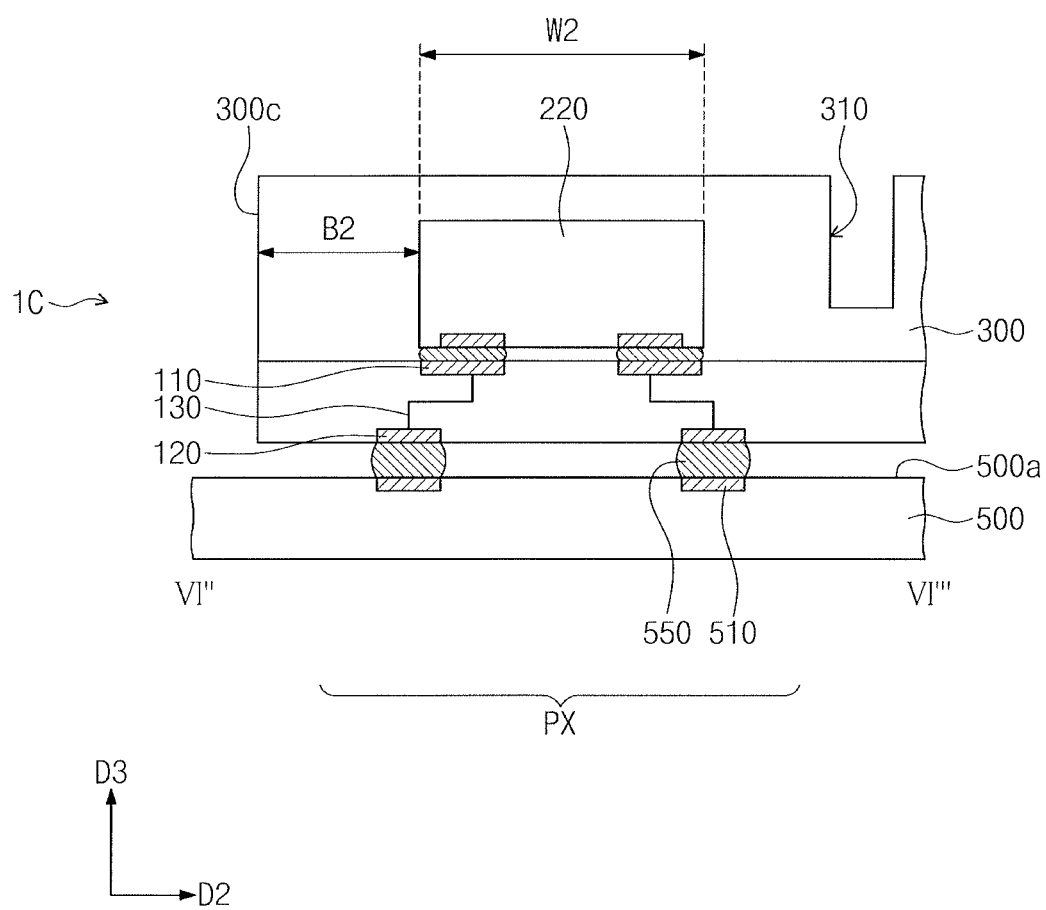
FIG. 7C illustrates a cross-sectional view taken along line VI"-VI'" of FIG. 7A.
Figure 7D:
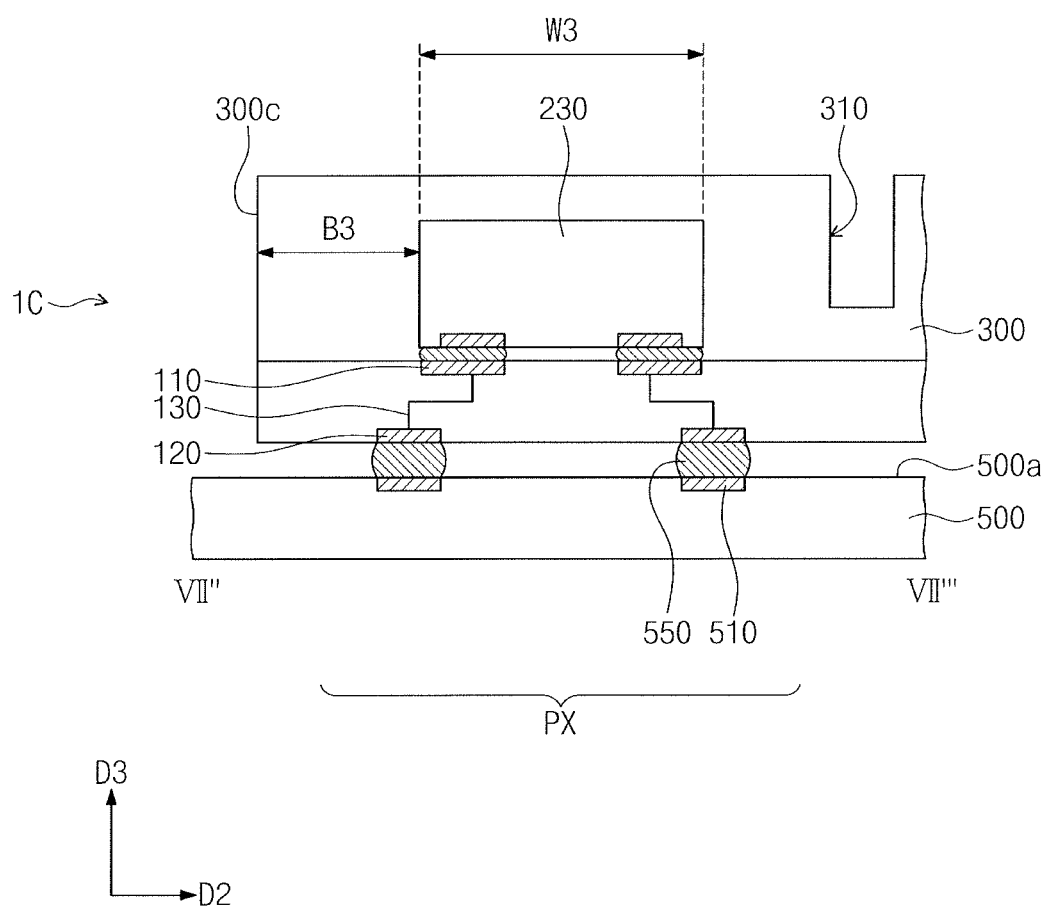
FIG. 7D illustrates a cross-sectional view taken along line VII"-VII'" of FIG. 7A.

FIG. 7A illustrates an enlarged plan view of section B in FIG. 6A, showing a display device according to some example embodiments. FIG. 7B illustrates a cross-sectional view taken along line IV"-IV"' of FIG. 7A. FIG. 7C illustrates a cross-sectional view taken along line VI"-VI"' of FIG. 7A. FIG. 7D illustrates a cross-sectional view taken along line VII"-VII"' of FIG. 7A. A duplicate description will be omitted below.

Referring to FIGS. 7A, 7B, 7C, and 7D, a display device may include the board 500 and a plurality of light-emitting packages 1C. The board 500 may be substantially the same as that in the examples discussed with reference to FIGS. 6A to 6C.

The light-emitting packages 1C may be mounted on the board 500. Each of the light-emitting packages 1C may be substantially the same as the light-emitting package 1C discussed above in FIGS. 5A to 5E. For example, on each of the pixel regions PX, the first light-emitting chip 210, the second light-emitting chip 220, and the third light-emitting chip 230 may be aligned with each other in the first direction D1.

The minimum interval B1 between the first light-emitting chip 210 and the first side surface 300c of the molding layer 300 may be different from the minimum interval B2 between the second light-emitting chip 220 and the first side surface 300c of the molding layer 300. The minimum interval B1 between the first light-emitting chip 210 and the first side surface 300c of the molding layer 300 may be different from the minimum interval B3 between the third light-emitting chip 230 and the first side surface 300c of the molding layer 300.

The minimum intervals B1, B2, and B3 between the first side surface 300c of the molding layer 300 and the first, second, and third light-emitting chips 210, 220, and 230 may be adjusted to help reduce a difference in color temperature, depending on the viewing angle, of light emitted from the display device.

One or more embodiments may provide a light-emitting package having a plurality of pixel regions.

Light-emitting packages according to an embodiment may exhibit an improvement in contrast.

According to an embodiment, each of the pixel regions may include a first light-emitting chip, a second light-emitting chip, and a third light-emitting chip. A minimum interval between the first light-emitting chip and a top surface of a molding layer may be different from that between the second light-emitting chip and the top surface of the molding layer, or a minimum interval between the first light-emitting chip and a side surface of the molding layer may be different from that between the second light-emitting chip and the side surface of the molding layer. The color temperature, depending on a viewing angle, of light emitted from light-emitting packages may become uniform.

A groove may be provided on the top surface of the molding layer. Light reflected from display devices may exhibit uniform contrast.

One or more embodiments may provide a light-emitting package having an improvement in color temperature difference.

One or more embodiments may provide a light-emitting package having increased contrast characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A light-emitting package, comprising:
   a substrate that has a plurality of pixel regions;
   a first light-emitting chip, a second light-emitting chip, and a third light-emitting chip on each of the pixel regions of the substrate; and
   a molding layer on a top surface of the substrate, the molding layer covering the first light-emitting chip, the second light-emitting chip, and the third light-emitting chip,
   wherein:
   one of the first light-emitting chip, the second light-emitting chip, and the third light-emitting chip is configured to emit light whose color is different from a color of light emitted from any of the others of the first light-emitting chip, the second light-emitting chip, and the third light-emitting chip,
   on each of the pixel regions, the first light-emitting chip, the second light-emitting chip, and the third light-emitting chip are arranged along a first direction, and the second light-emitting chip is between the first light-emitting chip and the third light-emitting chip, the first direction being parallel to the top surface of the substrate,
   a minimum interval between the first light-emitting chip and a top surface of the molding layer is different from a minimum interval between the second light-emitting chip and the top surface of the molding layer, or a minimum interval between the first light-emitting chip and a side surface of the molding layer is different from a minimum interval between the second light-emitting chip and the side surface of the molding layer,
   when viewed in plan perpendicular to the top surface of the substrate, the side surface of the molding layer intersects a second direction,
   the second direction is parallel to the top surface of the substrate and intersects the first direction, and
   a width of the first light-emitting chip in the second direction is different from a width of the second light-emitting chip in the second direction.

2. The light-emitting package as claimed in claim 1, wherein a top surface of the first light-emitting chip is at a level different from a level of a top surface of the second light-emitting chip.

3. The light-emitting package as claimed in claim 1, wherein:
   the top surface of the molding layer is perpendicular to a third direction, and
   the third direction intersects the top surface of the substrate.

4. The light-emitting package as claimed in claim 1, wherein the second light-emitting chip is laterally spaced apart from the first light-emitting chip and the third light-emitting chip.

5. The light-emitting package as claimed in claim 1, wherein the molding layer overlaps the pixel regions.

6. The light-emitting package as claimed in claim 5, wherein:
   a groove is on the top surface of the molding layer, and
   when viewed in plan perpendicular to the top surface of the substrate, the groove is spaced apart from the first light-emitting chip, the second light-emitting chip, and the third light-emitting chip.

7. The light-emitting package as claimed in claim 6, wherein, when viewed in plan perpendicular to the top surface of the substrate, the groove is between two adjacent pixel regions.

8. The light-emitting package as claimed in claim 7, wherein the groove includes:
   a first groove that extends parallel to the first direction; and
   a second groove that extends parallel to the second direction.

9. The light-emitting package as claimed in claim 6, wherein at least a part of the groove has:
   a shape in which an obtuse angle is formed between a bottom surface of the groove and a sidewall of the groove,
   a triangular cross-section,
   a semicircular cross-section, or
   a stepwise cross-section.

10. The light-emitting package as claimed in claim 1, further comprising a plurality of connection terminals between the substrate and a bottom surface of the first light-emitting chip, between the substrate and a bottom surface of the second light-emitting chip, and between the substrate and a bottom surface of the third light-emitting chip.

11. The light-emitting package as claimed in claim 1, wherein the first light-emitting chip is configured to emit light whose color is red or blue.

12. A light-emitting package, comprising:
a substrate that has a plurality of pixel regions;
a plurality of light-emitting chip groups on the pixel regions of the substrate, each of the light-emitting chip groups including a first light-emitting chip, a second light-emitting chip, and a third light-emitting chip that are spaced apart from each other;
a plurality of connection terminals between the substrate and the first light-emitting chip, between the substrate and the second light-emitting chip, and between the substrate and the third light-emitting chip; and
a molding layer on a top surface of the substrate, the molding layer covering the first light-emitting chip, the second light-emitting chip, and the third light-emitting chip,
wherein:
the molding layer has a groove on a top surface thereof,
one of the first light-emitting chip, the second light-emitting chip, and the third light-emitting chip is configured to emit light whose color is different from a color of light emitted from any of the others of the first light-emitting chip, the second light-emitting chip, and the third light-emitting chip,
in each of the light-emitting chip groups, the first light-emitting chip, the second light-emitting chip, and the third light-emitting chip are arranged along a first direction parallel to the top surface of the substrate,
a minimum distance between the first light-emitting chip and the top surface of the molding layer is different from a minimum distance between the second light-emitting chip and the top surface of the molding layer, or a minimum distance between the first light-emitting chip and a side surface of the molding layer is different from a minimum distance between the second light-emitting chip and the side surface of the molding layer,
the side surface of the molding layer is perpendicular to a second direction,
the top surface of the molding layer is perpendicular to a third direction,
the second direction is parallel to the top surface of the substrate and intersects the first direction,
the third direction intersects the top surface of the substrate, and
at least a part of the groove has:
a shape in which an obtuse angle is formed between a bottom surface of the groove and a sidewall of the groove,
a triangular cross-section,
a semicircular cross-section, or
a stepwise cross-section.

13. The light-emitting package as claimed in claim 12, wherein the first light-emitting chip has a height less than a height of the second light-emitting chip.

14. The light-emitting package as claimed in claim 12, wherein a width of the first light-emitting chip in the second direction is different from a width of the second light-emitting chip in the second direction.

15. The light-emitting package as claimed in claim 12, wherein the bottom surface of the groove is at a level lower than a level of a top surface of the second light-emitting chip.

16. A display device, comprising:
a board; and
a plurality of light-emitting packages on a top surface of the board,
wherein:
each of the light-emitting packages includes:
a substrate that has a plurality of pixel regions;
a first light-emitting chip, a second light-emitting chip, and a third light-emitting chip that are on a top surface of the substrate, the first light-emitting chip, the second light-emitting chip, and the third light-emitting chip being on each of the pixel regions; and
a molding layer on the top surface of the substrate, the molding layer covering the first light-emitting chip, the second light-emitting chip, and the third light-emitting chip,
one of the first light-emitting chip, the second light-emitting chip, and the third light-emitting chip is configured to emit light whose color is different from a color of light emitted from any of the others of the first light-emitting chip, the second light-emitting chip, and the third light-emitting chip,
in each of the light-emitting packages, the first light-emitting chip, the second light-emitting chip, and the third light-emitting chip are arranged along a first direction parallel to the top surface of the substrate,
a minimum distance between the first light-emitting chip and a top surface of the molding layer is different from a minimum distance between the second light-emitting chip and the top surface of the molding layer, or a minimum distance between the first light-emitting chip and a side surface of the molding layer is different from a minimum distance between the second light-emitting chip and the side surface of the molding layer,
the side surface of the molding layer is perpendicular to a second direction,
the second direction is parallel to the top surface of the substrate and intersects the first direction,
the top surface of the molding layer is perpendicular to a third direction that intersects the top surface of the substrate, and
a width of the first light-emitting chip in the second direction is different from a width of the second light-emitting chip in the second direction.

17. The display device as claimed in claim 16, wherein the board has a first side surface and a second side surface, the first side surface abuts the top surface of the board, the second side surface abuts the top surface of the board and faces the first side surface, and
the first direction is parallel to the first and second side surfaces of the board.

18. The display device as claimed in claim 16, wherein:
the molding layer has a groove on the top surface thereof, and
the groove is between two adjacent pixel regions.

19. The display device as claimed in claim 16, wherein a top surface of the first light-emitting chip is at a level lower than a level of a top surface of the second light-emitting chip and lower than a level of a top surface of the third light-emitting chip.

20. The display device as claimed in claim 18, wherein at least a part of the groove has:
- a shape in which an obtuse angle is formed between a bottom surface of the groove and a sidewall of the groove,
- a triangular cross-section,
- a semicircular cross-section, or
- a stepwise cross-section.

\* \* \* \* \*